(12) United States Patent
Wang et al.

(10) Patent No.: US 12,379,801 B2
(45) Date of Patent: Aug. 5, 2025

(54) DISPLAY SUBSTRATE AND DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Wei Wang, Beijing (CN); Tianci Chen, Beijing (CN); Yi Zhang, Beijing (CN); Junxiu Dai, Beijing (CN); Chang Luo, Beijing (CN); Siyu Wang, Beijing (CN); Yu Wang, Beijing (CN); Ping Wen, Beijing (CN); Yang Zeng, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/294,319

(22) PCT Filed: Sep. 27, 2022

(86) PCT No.: PCT/CN2022/121640
§ 371 (c)(1),
(2) Date: Feb. 1, 2024

(87) PCT Pub. No.: WO2024/065162
PCT Pub. Date: Apr. 4, 2024

(65) Prior Publication Data
US 2025/0077008 A1 Mar. 6, 2025

(51) Int. Cl.
*G06F 3/041* (2006.01)
*H10K 59/40* (2023.01)
*G06F 3/044* (2006.01)

(52) U.S. Cl.
CPC ........ *G06F 3/0412* (2013.01); *H10K 59/40* (2023.02); *G06F 3/0443* (2019.05);
(Continued)

(58) Field of Classification Search
None
See application file for complete search history.

(56) References Cited

U.S. PATENT DOCUMENTS

2015/0193048 A1 7/2015 Yang
2018/0366081 A1 12/2018 Jangda et al.
(Continued)

FOREIGN PATENT DOCUMENTS

CN 202929606 U 5/2013
CN 103853411 A 6/2014
(Continued)

*Primary Examiner* — Duane N Taylor, Jr.
(74) *Attorney, Agent, or Firm* — HOUTTEMAN LAW LLC

(57) ABSTRACT

Provided are a display substrate and a display apparatus. The display apparatus includes a base substrate including a display region and a bezel region on at least one side of the display region; and a plurality of touch lines in the bezel region, including a plurality of touch drive lines and a plurality of touch sensing lines, where a first distance is provided between any two adjacent touch drive lines in the plurality of touch drive lines, a second distance is provided between any two adjacent touch sensing lines in the plurality of touch sensing lines, a third distance is provided between the plurality of touch drive lines and the plurality of touch sensing lines, the first distance is substantially equal to the second distance, and the third distance is greater than each of the first distance and the second distance.

20 Claims, 14 Drawing Sheets

(52) U.S. Cl.
CPC .............. *G06F 2203/04102* (2013.01); *G06F 2203/04107* (2013.01); *G06F 2203/04111* (2013.01)

(56) References Cited

U.S. PATENT DOCUMENTS

| | | | |
|---|---|---|---|
| 2019/0346987 A1* | 11/2019 | Shi | G06F 3/04164 |
| 2020/0081576 A1* | 3/2020 | Takada | G06F 3/0446 |
| 2020/0103993 A1 | 4/2020 | Krah et al. | |
| 2020/0401274 A1* | 12/2020 | Moon | G06F 3/0445 |

FOREIGN PATENT DOCUMENTS

| | | |
|---|---|---|
| CN | 203733094 U | 7/2014 |
| CN | 104516610 A | 4/2015 |
| CN | 204347806 U | 5/2015 |
| CN | 108598142 A | 9/2018 |
| CN | 112817481 A | 5/2021 |
| CN | 113050840 A | 6/2021 |
| CN | 216286614 U | 4/2022 |
| CN | 114721534 A | 7/2022 |

\* cited by examiner

DISPLAY SUBSTRATE AND DISPLAY APPARATUS

TECHNICAL FIELD

The present disclosure relates to the field of display technology, and particularly relates to a display substrate and a display apparatus.

BACKGROUND

The organic light-emitting element (OLED) display apparatus is an OLED based display screen that has excellent characteristics of self-luminescence, high contrast, thinness, wide visual angle, fast response, applicability to flexible panels, wide operating temperature range, simple structure and manufacture procedure and the like, and that is gaining more and more attention and has a wide application prospect. In the existing art, a touch function is integrated through a touch module embedded into an OLED display module, so that the display function and the touch function are integrated into the OLED display apparatus.

SUMMARY

The present disclosure provides a display substrate and a display apparatus, and adopts the specific solutions as follows:

In one aspect, an embodiment of the present disclosure provides a display substrate, including:
  a base substrate including a display region and a bezel region on at least one side of the display region;
  a plurality of touch lines in the bezel region, including a plurality of touch drive lines and a plurality of touch sensing lines, wherein a first distance is provided between any two adjacent touch drive lines in the plurality of touch drive lines, a second distance is provided between any two adjacent touch sensing lines in the plurality of touch sensing lines, a third distance is provided between the plurality of touch drive lines and the plurality of touch sensing lines, the first distance is substantially equal to the second distance, and the third distance is greater than each of the first distance and the second distance.

In some embodiments, in the display substrate provided in the embodiments of the present disclosure, a blank is reserved between the plurality of touch drive lines and the plurality of touch sensing lines.

In some embodiments, the display substrate provided in the embodiments of the present disclosure further includes at least one shield line between the plurality of touch drive lines and the plurality of touch sensing lines.

In some embodiments, in the display substrate provided in the embodiments of the present disclosure, the shield line has a line width greater than or equal to 2.5 times the first distance, and less than or equal to 12.5 times the first distance.

In some embodiments, in the display substrate provided in the embodiments of the present disclosure, a fourth distance is provided between the at least one shield line and the plurality of touch drive lines, a fifth distance is provided between the at least one shield line and the plurality of touch sensing lines, and the fourth distance and the fifth distance are each greater than or equal to the first distance, and less than or equal to 12.5 times the first distance.

In some embodiments, in the display substrate provided in the embodiments of the present disclosure, the number of the at least one shield line is 1, and the fourth distance and the fifth distance are each greater than a line width of the shield line.

In some embodiments, in the display substrate provided in the embodiments of the present disclosure, the number of the at least shield line is a positive integer, and the fourth distance and the fifth distance are each smaller than a line width of the shield line.

In some embodiments, in the display substrate provided in the embodiments of the present disclosure, the number of the at least one shield line is greater than or equal to 2, a sixth distance is provided between any two adjacent shield lines, and the sixth distance, the fourth distance and the fifth distance are substantially the same.

In some embodiments, in the display substrate provided in the embodiments of the present disclosure, the number of the at least one shield line is greater than or equal to 3, and the fourth distance, the fifth distance, and the sixth distance are each substantially equal to the first distance.

In some embodiments, in the display substrate provided in the embodiments of the present disclosure, the line width of the shield line is inversely related to the number of the at least one shield line.

In some embodiments, in the display substrate provided in the embodiments of the present disclosure, the bezel region includes a first bezel region on a side of the display region, a second bezel region opposite to the first bezel region, and a third bezel region and a fourth bezel region each connecting the first bezel region and the second bezel region, wherein the first bezel region includes a first fan-out region, a bending region, and a second fan-out region arranged in sequence along a direction away from the display region; and
  the at least one shield line each includes a main body part and at least two branch parts, wherein the main body part and the at least two branch parts of the same shield line are integrally formed, the main body part is located in the second fan-out region and the bending region, and the at least two branch parts are located in at least parts of the first fan-out region, the second bezel region, the third bezel region, and the fourth bezel region.

In some embodiments, in the display substrate provided in the embodiments of the present disclosure, the main body part has a line width substantially equal to 2.5 times the first distance.

In some embodiments, in the display substrate provided in the embodiments of the present disclosure, a seventh distance is provided between the main body part and the plurality of touch drive lines, an eighth distance is provided between the main body part and the plurality of touch sensing lines, and the seventh distance and the eighth distance are each greater than or equal to the first distance, and less than or equal to 4.5 times the first distance.

In some embodiments, in the display substrate provided in the embodiments of the present disclosure, each branch part has a line width greater than or equal to 2.5 times the first distance, and less than or equal to 12.5 times the first distance.

In some embodiments, in the display substrate provided in the embodiments of the present disclosure, a ninth distance is provided between the branch parts and the plurality of touch drive lines, a tenth distance is provided between the branch parts and the plurality of touch sensing lines, and the ninth distance and the tenth distance are each greater than or equal to the first distance, and less than or equal to 12.5 times the first distance.

In some embodiments, in the display substrate provided in the embodiments of the present disclosure, in the second fan-out region, the touch drive line and/or the touch sensing line on at least one side of the main body part each include: a first touch part, a second touch part, and a third touch part connected in sequence along a direction away from the display region, wherein an eleventh distance is provided between the first touch part and the main body part, a twelfth distance is provided between the second touch part and the main body part, a thirteenth distance is provided between the third touch part and the main body part, the eleventh distance is substantially equal to the first distance, the twelfth distance is greater than the first distance and less than 4.5 times the first distance, and the thirteenth distance is substantially equal to 4.5 times the first distance.

In some embodiments, the display substrate provided in the embodiments of the present disclosure further includes at least one ground line between the plurality of touch drive lines and the plurality of touch sensing lines, wherein the ground line and the shield line are disposed independent from each other.

In some embodiments, in the display substrate provided in the embodiments of the present disclosure, the at least one ground line and the at least one shield line are arranged alternatively between the plurality of touch drive lines and the plurality of touch sensing lines.

In some embodiments, in the display substrate provided in the embodiments of the present disclosure, at least part of the at least one shield line is disposed closer to the plurality of touch drive lines than the at least one ground line.

In some embodiments, in the display substrate provided in the embodiments of the present disclosure, the third distance is greater than or equal to 4.5 times the first distance, and less than or equal to 37.5 times the first distance.

In some embodiments, in the display substrate provided in the embodiments of the present disclosure, each touch line has a line width substantially equal to 2.5 times the first distance.

In another aspect, an embodiment of the present disclosure provides a display apparatus, including the display substrate provided in the above embodiments of the present disclosure.

In some embodiments, the display apparatus provided in the embodiments of the present disclosure further includes a flexible printed circuit electrically connected to the display substrate and located on an opposite side to a display side of the display apparatus.

In some embodiments, in the display apparatus provided in the embodiments of the present disclosure, the display substrate includes a display region, and a first bezel region on a side of the display region and configured to be bonded to the flexible printed circuit; wherein the first bezel region includes a first fan-out region, a bending region, and a second fan-out region arranged in sequence along a direction away from the display region, wherein the first fan-out region is located on the display side, and the second fan-out region is located on the opposite side.

DETAIL DESCRIPTION OF EMBODIMENTS

Figure 1:
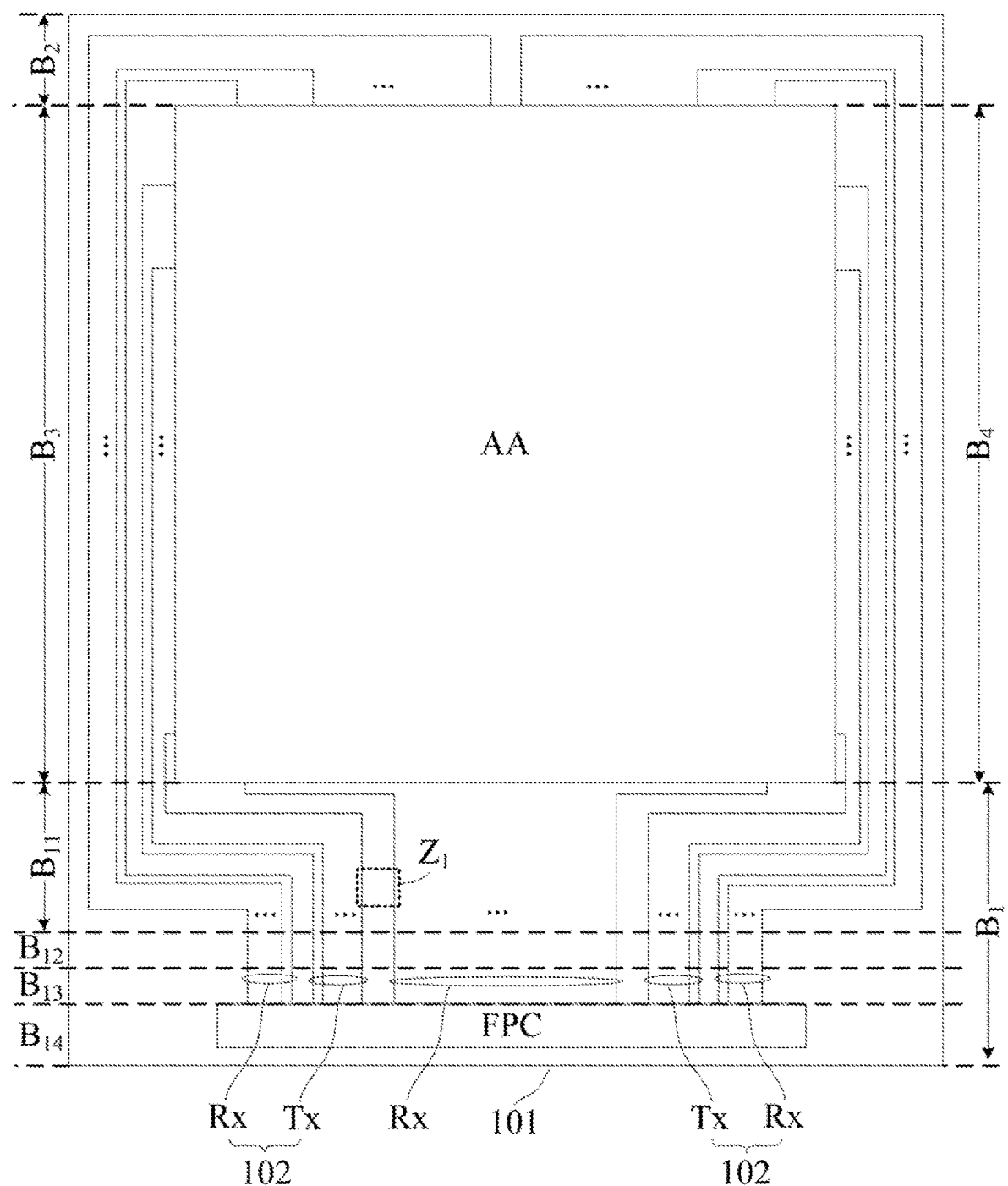
FIG. 1 is a schematic structural view of a display substrate according to an embodiment of the present disclosure.

To make the objects, technical solutions and advantages of the embodiments of the present disclosure more apparent, the technical solutions according to the embodiments of the present disclosure will be clearly and completely described below with reference to the drawings of the embodiments of the present disclosure. It should be noted that the sizes and shapes of various components in the drawings are not to scale, but are merely intended to schematically illustrate the present disclosure. The same or similar reference signs refer to the same or similar elements or elements with the same or similar functions throughout the drawings. To keep the following description of the embodiments of the present disclosure clear and concise, detailed description of known functions and known components is omitted herein.

Unless otherwise defined, technical or scientific terms used herein are intended to have general meanings as understood by those skilled in the art to which the present disclosure belongs. The words "first", "second" and similar terms used in the description and the claims of the present disclosure do not denote any order, quantity, or importance, but are used merely for distinguishing different components from each other. The word "comprising" or "including" or the like means that the element or item preceding the word contains elements or items that appear after the word or equivalents thereof, but does not exclude other elements or items. The words "inner", "outer", "upper", "lower", and the like are merely used to indicate a relative positional relationship, and when an absolute position of the described object is changed, the relative positional relationship may be changed accordingly.

In the existing art, two metal layers, i.e., a metal mesh layer and a bridging layer, are used to manufacture a touch function layer. The metal mesh is located in a display region AA, and may be divided into touch drive electrodes and touch sensing electrodes according to the horizontal and vertical directions, where one of the touch drive electrodes or the touch sensing electrodes are connected with each other, while the other of the touch drive electrodes or the touch sensing electrodes are connected through the bridging layer. Therefore, an out-of-cell touch screen panel (TSP) is omitted, which can reduce the thickness of the screen and facilitate folding; and meanwhile, the bezel width can be reduced since there is no fitting tolerance.

To provide valid signals for the touch drive electrodes and the touch sensing electrodes, touch drive lines electrically connected to the touch drive electrodes, and touch sensing lines connected to the touch sensing electrodes, are disposed in a bezel region around the display region AA. However, in the existing art, a distance between the touch drive lines and the touch sensing lines is the same as or similar to a distance between two adjacent touch drive lines and a distance between two adjacent touch sensing lines, so that a relatively large parasitic capacitance is present between the touch drive lines and the touch sensing lines, which may cause mutual interference between touch drive signals of the touch drive lines and touch sensing signals of the touch sensing lines, and thus affect the touch performance.

To address the above technical problem in the existing art, an embodiment of the present disclosure provides a display substrate which, referring to FIGS. 1 to 4, includes:
- a base substrate 101 including a display region AA, and a bezel region (e.g., $B_1$, $B_2$, $B_3$, $B_4$) on at least one side of the display region AA; and
- a plurality of touch lines 102 in the bezel region (e.g., $B_1$, $B_2$, $B_3$, $B_4$), including a plurality of touch drive lines Tx and a plurality of touch sensing lines Rx. A first distance $d_1$ is provided between two adjacent touch drive lines Tx in the plurality of touch drive lines Tx, a second distance $d_2$ is provided between two adjacent touch sensing lines Rx in the plurality of touch sensing lines Rx, and a third distance $d_3$ is provided between the plurality of touch drive lines Tx as a whole and the plurality of touch sensing lines Rx as a whole. The first distance $d_1$ is substantially equal to (i.e., equal to or within a 5% error range due to the manufacturing process, measurement, etc.) the second distance $d_2$, and the third distance $d_3$ is greater than each of the first distance $d_1$ and the second distance $d_2$.

In the display substrate provided in the embodiments of the present disclosure, by providing the third distance $d_3$ between the plurality of touch drive lines Tx as a whole and the plurality of touch sensing lines Rx as a whole to be greater than each of the first distance $d_1$ between two adjacent touch drive lines Tx and the second distance $d_2$ between two adjacent touch sensing lines Rx, the third distance $d_3$ between the plurality of touch drive lines Tx as a whole and the plurality of touch sensing lines Rx as a whole is increased, so that the parasitic capacitance between the plurality of touch drive lines Tx as a whole and the plurality of touch sensing lines Rx as a whole is reduced, which can reduce the interference of the parasitic capacitance on the touch drive signals of the touch drive lines Tx and the touch sensing signals of the touch sensing lines Rx, and improve the touch performance.

In some embodiments, in the display substrate provided in the embodiments of the present disclosure, the third distance $d_3$ may be set to be greater than or equal to 4.5 times the first distance $d_1$, and less than or equal to 37.5 times the first distance $d_1$. For example, the third distance $d_3$ is 4.5 times, 14.5 times, 25 times, 37.5 times the first distance $d_1$, or the like. Exemplarily, the first distance $d_1$ is 4 μm, and the third distance $d_3$ is 18 μm, 58 μm, 100 μm, 150 μm, or the like. Under the condition that the third distance $d_3$ between the plurality of touch drive lines Tx as a whole and the plurality of touch sensing lines Rx as a whole and the first distance $d_1$ between two adjacent touch drive lines Tx satisfy the above magnitude relationship, not only can the interference caused by the parasitic capacitance be well reduced, but also the space of the bezel region (e.g., $B_1$, $B_2$, $B_3$, $B_4$) can be sufficiently utilized, so that the bezel region (e.g., $B_1$, $B_2$, $B_3$, $B_4$) will not have a large width caused by an overlarge third distance $d_3$, that is, can still satisfy a narrow-bezel design.

Figure 2:
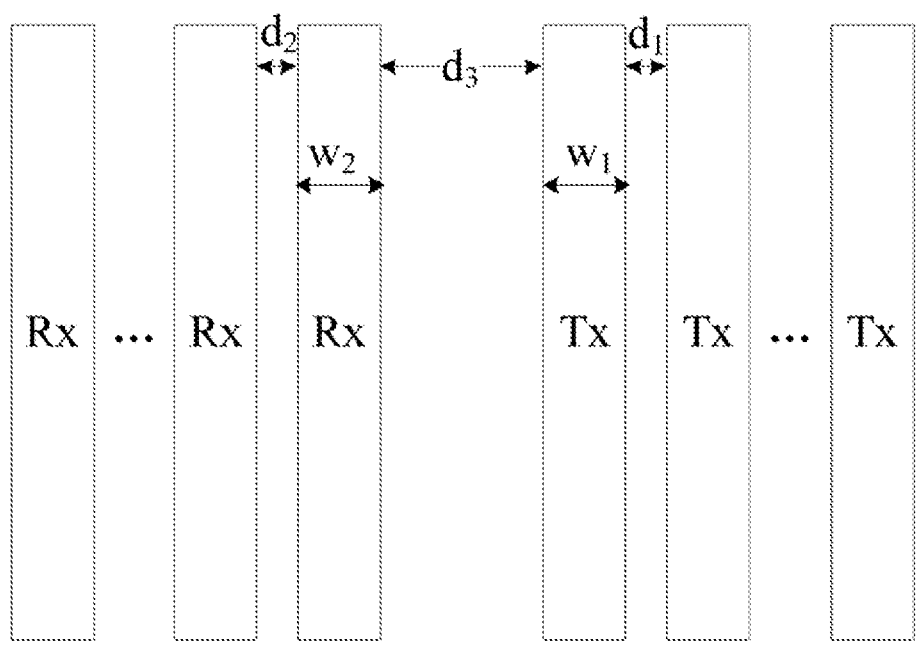
FIG. 2 is a schematic enlarged structural view of region $Z_1$ in FIG. 1.

In some embodiments, as shown in FIGS. 1 and 2, in the display substrate provided in the embodiments of the present disclosure, a blank may be reserved between the plurality of touch drive lines Tx as a whole and the plurality of touch sensing lines Rx as a whole. In other words, no wire is provided between the plurality of touch drive lines Tx as a whole and the plurality of touch sensing lines Rx as a whole, and the parasitic capacitance between the plurality of touch drive lines Tx as a whole and the plurality of touch sensing lines Rx as a whole is reduced simply by increasing the third distance $d_3$.

Considering that among the plurality of touch drive lines Tx and the plurality of touch sensing lines Rx, the mutual interference is mainly present between a touch drive line Tx and a touch sensing line Rx with the smallest distance therebetween, taking a third distance $d_3$ provided between one touch drive line Tx and one touch sensing line Rx as an example, the present disclosure tests the parasitic capacitance between the two lines under different third distances $d_3$. Optionally, the present disclosure provides the touch drive line Tx having a line length of 100 μm and a line width $w_2$ of 10 μm, the touch sensing line Rx having a line length of 100 μm and a line width $w_3$ of 10 μm, and parasitic capacitances where the third distance $d_3$ between the touch drive line Tx and the touch sensing line Rx is 4 μm and 18 μm, respectively. The result shows that where the third distance $d_3$ is 4 μm, the parasitic capacitance is 4.55 fF, and where the third distance $d_3$ is 18 μm, the parasitic capacitance is 1.54 fF. As can be seen, where the third distance $d_3$ is increased to 18 μm, the parasitic capacitance is reduced by about 66% compared with the solution with the third distance $d_3$ being 4 μm.

In some embodiments, as shown in FIGS. 3 to 11, the display substrate provided in the embodiments of the present disclosure may further include at least one shield line 103 between the plurality of touch drive lines Tx as a whole and the plurality of touch sensing lines Rx as a whole. In other words, at least one shield line 103 is provided in the third distance $d_3$ between the plurality of touch drive lines Tx as a whole and the plurality of touch sensing lines Rx as a whole. Therefore, the plurality of touch drive lines Tx as a whole can be separated from the plurality of touch sensing lines Rx as a whole by the shield line 103, thereby effectively shielding mutual interference between the touch drive signals of the touch drive lines Tx and the touch sensing signals of the touch sensing lines Rx, and contributing to improving the touch performance.

In some embodiments, as shown in FIGS. 4 to 11, in the display substrate provided in the embodiments of the present disclosure, the shield line 103 may have a line width $w_1$ greater than or equal to 2.5 times the first distance $d_1$, and less than or equal to 12.5 times the first distance $d_1$. The shield line 103 within this width range can well shield and isolate from each other the touch drive signals of the touch drive lines Tx and the touch sensing signals of the touch sensing lines Rx on two sides of the shield line 103, thereby avoiding mutual interference between the touch drive signals and the touch sensing signals. Optionally, the line width $w_1$ of the shield line 103 may be equal to 2.5 times, 3.8 times, 5 times, 7 times, 8.75 times, 12.5 times the first distance $d_1$, or the like. Exemplarily, the first distance $d_1$ is 4 μm, and the line width $w_1$ of the shield line 103 may be 10 μm, 15.2 μm, 20 μm, 28 μm, 35 μm, 50 μm, or the like.

In some embodiments, as shown in FIGS. 4 to 11, in the display substrate provided in the embodiments of the present disclosure, each touch line 102 may have a line width (e.g., the line width $w_2$ of the touch drive line Tx or the line width $w_3$ of the touch sensing line Rx) substantially equal to (i.e., equal to or within a 5% error range due to the manufacturing process, measurement, etc.) 2.5 times the first distance $d_1$. With such a line width, the touch line 102 may have a relatively small resistance, and the risk of breakage of the touch line 102 due to over-thinning can be effectively reduced. Exemplarily, the first distance $d_1$ is 4 μm, while the line width $w_2$ of the touch drive line Tx and the line width $w_3$ of the touch sensing line Rx are both 10 μm. Since the line width $w_1$ of the shield line 103 is greater than or equal to 2.5 times the first distance $d_1$, and less than or equal to 12.5 times the first distance $d_1$, the line width $w_1$ of the shield line 103 is greater than or equal to the line width of the touch line 102 (e.g., the line width $w_2$ of the touch drive line Tx or the line width $w_3$ of the touch sensing line Rx). Optionally, the line width $w_1$ of the shield line 103 may have a maximum value equal to 5 times the line width of the touch line 102 (e.g., the line width $w_2$ of the touch drive line Tx or the line width $w_3$ of the touch sensing line Rx).

In some embodiments, as shown in FIGS. 4 to 11, in the display substrate provided in the embodiments of the present disclosure, a fourth distance $d_4$ is provided between the at least one shield line 103 as a whole and the plurality of touch drive lines Tx as a whole, and a fifth distance $d_5$ is provided between the at least one shield line 103 as a whole and the plurality of touch sensing lines Rx as a whole. Optionally, the fourth distance $d_4$ and the fifth distance $d_5$ may be each greater than or equal to the first distance $d_1$ and less than or equal to 12.5 times the first distance $d_1$. Under the condition that the fourth distance $d_4$ and the fifth distance $d_5$ are each equal to the first distance $d_1$, a short circuit between the shield line 103 and the touch drive lines Tx, as well as a short circuit between the shield line 103 and the touch sensing lines Rx, can be avoided. Under the condition that the fourth distance $d_4$ and the fifth distance $d_5$ are each equal to 12.5 times the first distance $d_1$, the effects of a narrow bezel and parasitic capacitance interference prevention can be achieved at the same time. In some embodiments, each of the fourth distance $d_4$ and the fifth distance $d_5$ may be 1 time, 2.5 times, 6 times, 12.5 times the first distance $d_1$, or the like. Optionally, the first distance $d_1$ is 4 μm, and each of the fourth distance $d_4$ and the fifth distance $d_5$ is 4 μm, 10 μm, 24 μm, 50 μm, or the like.

It should be noted that, limited by the wiring space, the line width of a single touch line 102 (e.g., the line width $w_2$ of the touch drive line Tx or the line width $w_3$ of the touch sensing line Rx), the third distance $d_3$ between the plurality of touch drive lines Tx as a whole and the plurality of touch sensing lines Rx as a whole, the line width $w_1$ of a single shield line 103, the fourth distance $d_4$ between the at least one shield line 103 as a whole and the plurality of touch drive lines Tx as a whole, and the fifth distance $d_5$ between the at least one shield line 103 as a whole and the plurality of touch sensing lines Rx as a whole, may differ to some extent at different positions of the bezel region (e.g., $B_1$, $B_2$, $B_3$, $B_4$). The magnitude relationships among the related parameters defined in the present disclosure may be regarded as definitions of the magnitude relationships among a touch drive line Tx, a touch sensing line Rx, and a shield line 103 in the same region and having approximately parallel tracing trends.

Figure 5:
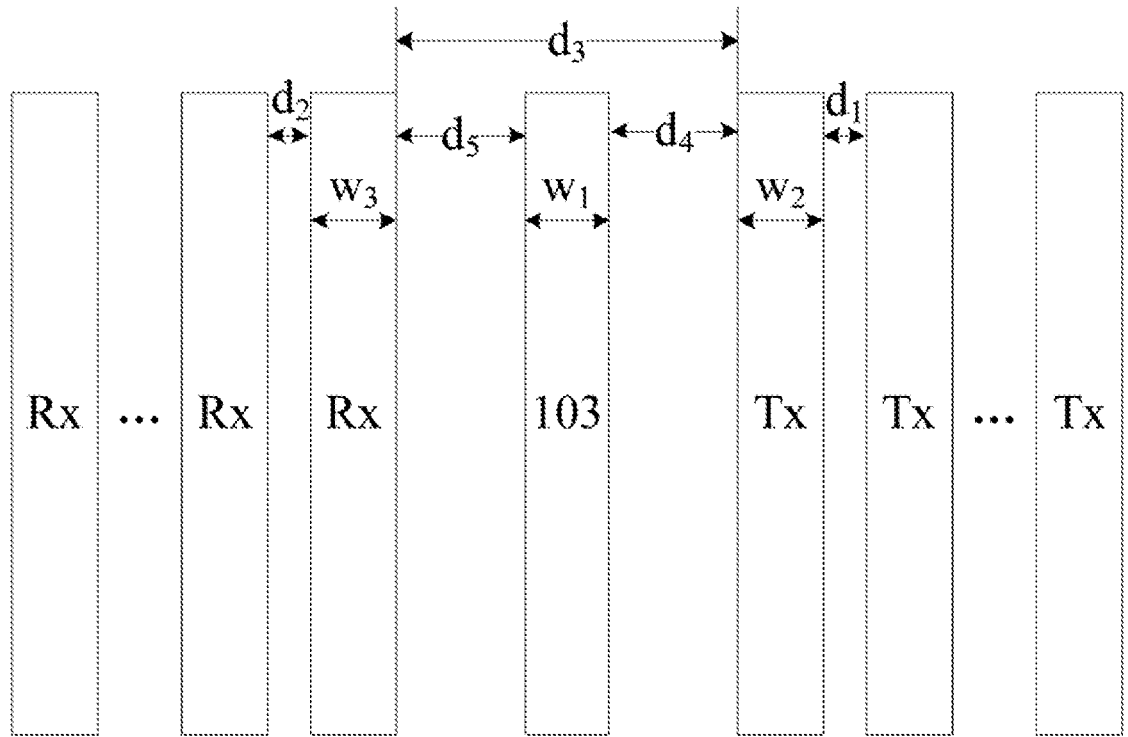
FIG. 5 is another schematic enlarged structural view of region $Z_2$ in FIG. 3.

In some embodiments, as shown in FIG. 5, in the display substrate provided in the embodiments of the present disclosure, the number of shield lines 103 included in the at least one shield line 103 as a whole may be 1, in which case, the fourth distance $d_4$ between the shield line 103 as a whole and the plurality of touch drive lines Tx as a whole, and the fifth distance $d_5$ between the shield line 103 and the plurality of touch sensing lines Rx as a whole may be each greater than the line width $w_1$ of the shield line 103. In this case, the fourth distance $d_4$ and the fifth distance $d_5$ are controlled to be larger to minimize mutual interference of the touch drive signals of the touch drive lines Tx and the touch sensing signals of the touch sensing lines Rx on two sides of the shield line 103.

In some embodiments, as shown in FIGS. 4 and 6 to 11, in the display substrate provided in the embodiments of the present disclosure, the number of the at least one shield line 103 is a positive integer (e.g., 1, 2, 3, 4, 5, etc.), in which case, the fourth distance $d_4$ between the at least one shield line 103 as a whole and the plurality of touch drive lines Tx as a whole, and the fifth distance $d_5$ between the at least one shield line 103 as a whole and the plurality of touch sensing lines Rx as a whole, may be each less than the line width $w_1$ of the shield line 103. A larger line width $w_1$ of the shield line 103 will lead to a better shielding effect. Therefore, the line width $w_1$ of the shield line 103 may be set to be greater than each of the fourth distance $d_4$ and the fifth distance $d_5$ to ensure a large line width $w_1$ of the shield line 103, so that the mutual interference between the touch drive signals of the touch drive lines Tx and the touch sensing signals of the touch sensing lines Rx can be shielded to a larger extent by the at least one shield line 103 as a whole.

Figure 4:
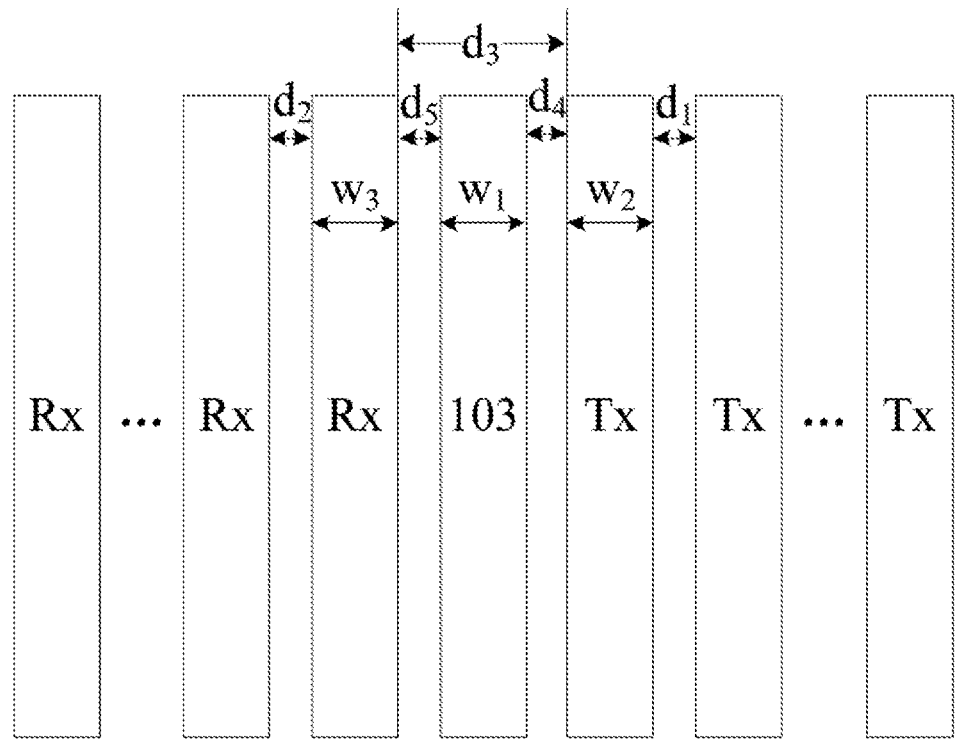
FIG. 4 is a schematic enlarged structural view of region $Z_2$ in FIG. 3.
Figure 6:
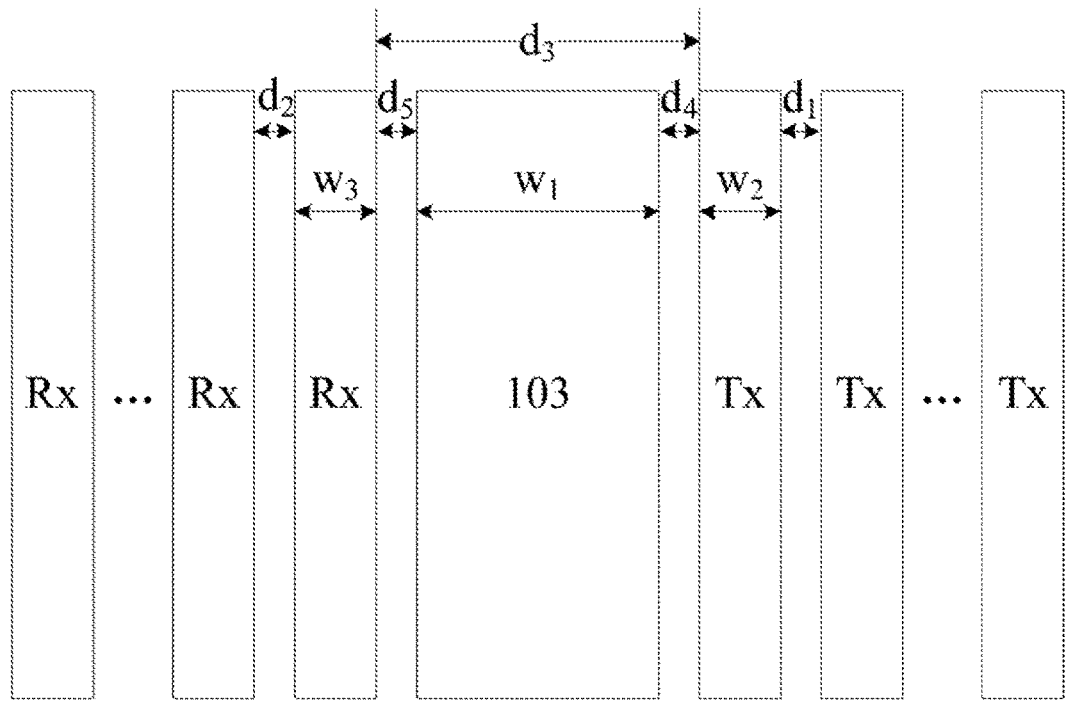
FIG. 6 is another schematic enlarged structural view of region $Z_2$ in FIG. 3.
Figure 7:
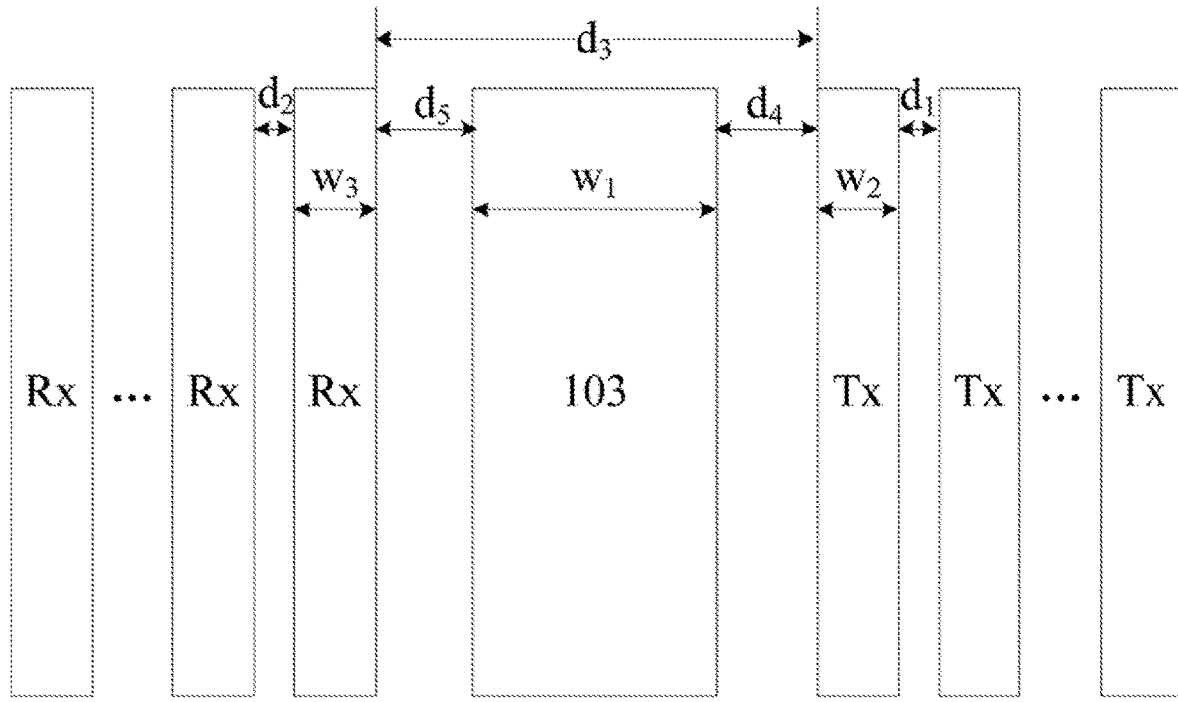
FIG. 7 is another schematic enlarged structural view of region $Z_2$ in FIG. 3.
Figure 8:
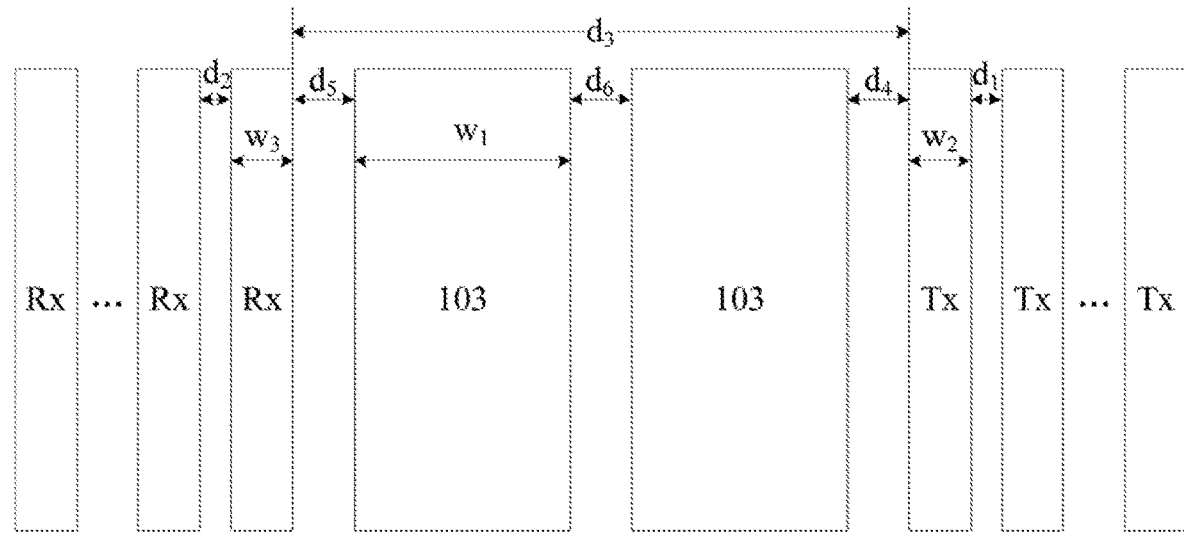
FIG. 8 is another schematic enlarged structural view of region $Z_2$ in FIG. 3.
Figure 9:
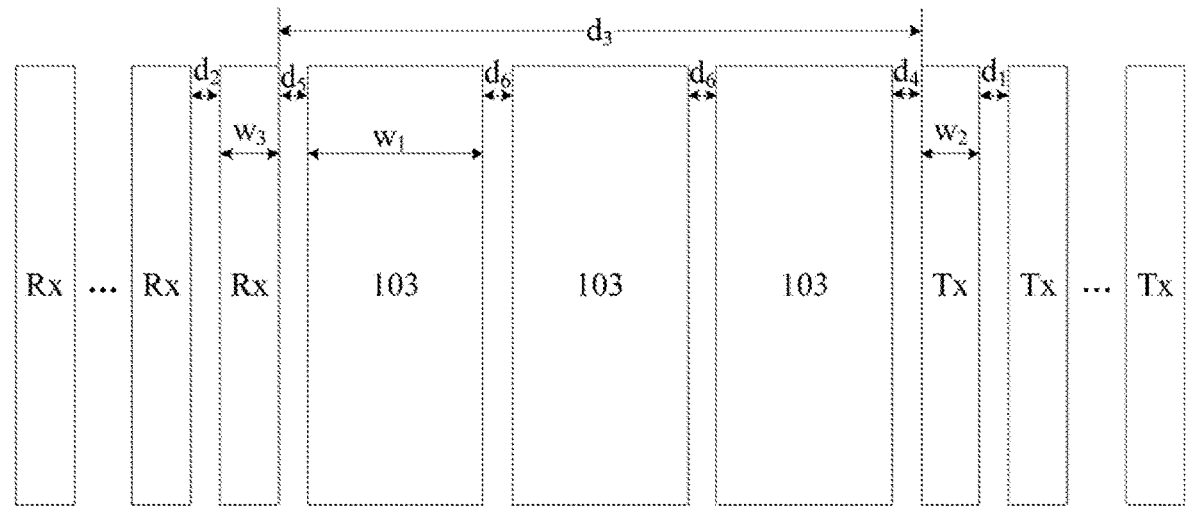
FIG. 9 is another schematic enlarged structural view of region $Z_2$ in FIG. 3.
Figure 10:
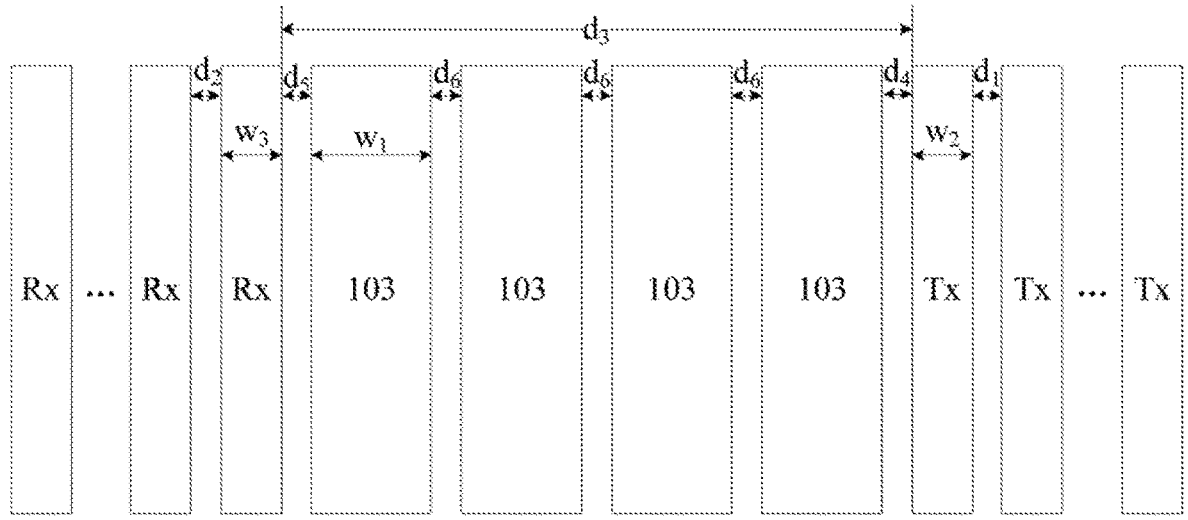
FIG. 10 is another schematic enlarged structural view of region $Z_2$ in FIG. 3.
Figure 11:
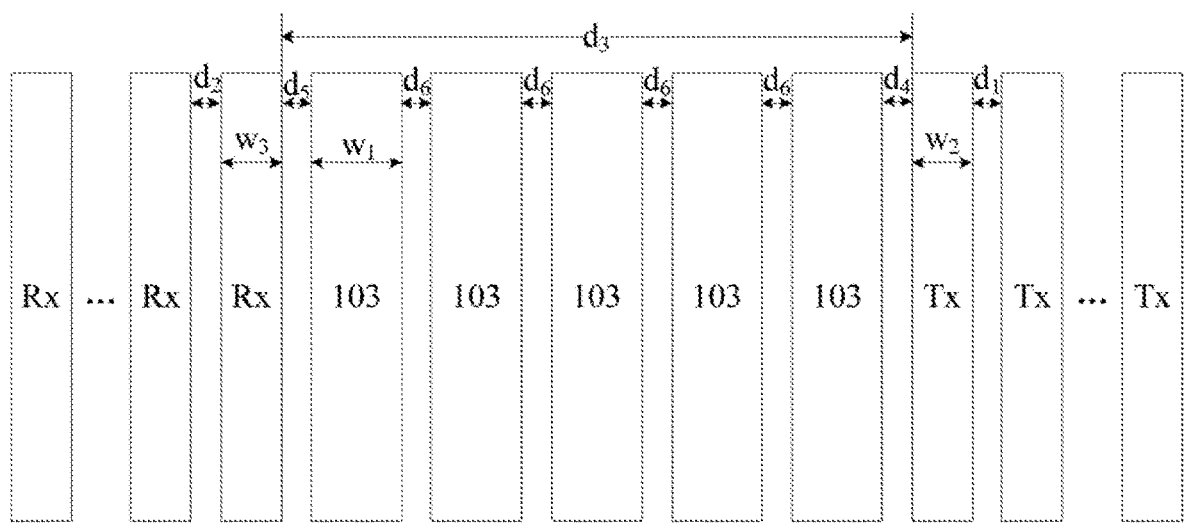
FIG. 11 is another schematic enlarged structural view of region $Z_2$ in FIG. 3.

Exemplarily, in FIG. 4, one shield line 103 is provided, each of the fourth distance $d_4$ and the fifth distance $d_5$ is 4 μm, and the line width $w_1$ of the shield line 103 is 10 μm; in FIG. 6, one shield line 103 is provided, each of the fourth distance $d_4$ and the fifth distance $d_5$ is 4 μm, and the line width $w_1$ of the shield line 103 is 50 μm; in FIG. 7, one shield line 103 is provided, each of the fourth distance $d_4$ and the fifth distance $d_5$ is 25 μm, and the line width $w_1$ of the shield line 103 is 50 μm; in FIG. 8, two shield lines 103 are provided, each of the fourth distance $d_4$ and the fifth distance $d_5$ is 10 μm, and the line width $w_1$ of each shield line 103 is 35 μm; in FIG. 9, three shield lines 103 are provided, each of the fourth distance $d_4$ and the fifth distance $d_5$ is 4 μm, and the line width $w_1$ of each shield line 103 is 28 μm; in FIG. 10, four shield lines 103 are provided, each of the fourth distance $d_4$ and the fifth distance $d_5$ is 4 μm, and the line width $w_1$ of each shield line 103 is 20 μm; and in FIG. 11, five shield lines 103 are provided, each of the fourth distance $d_4$ and the fifth distance $d_5$ is 4 μm, and the line width $w_1$ of each shield line 103 is 15.2 μm. In addition, in FIG. 5, one shield line 103 is provided, each of the fourth distance $d_4$ and the fifth distance $d_5$ is 24 μm, and the line width $w_1$ of the shield line 103 is 10 μm.

Accordingly, in the present disclosure, the parasitic capacitance between one touch drive line Tx and one touch sensing line Rx on two sides of the third distance $d_3$ in each of FIG. 4 to 11 is tested. Optionally, in FIGS. 4 to 11, the touch drive line Tx has a line length of 100 μm and a line width $w_2$ of 10 μm, the touch sensing line Rx has a line length of 100 μm and a line width $w_3$ of 10 μm, and the shield line 103 has a line length of 100 μm.

The result shows that in the solution shown in FIG. 4, the parasitic capacitance between the touch drive line Tx and the touch sensing line Rx is 0.54 fF. As can be seen from the above, the third distance $d_3$ in the solution shown in FIG. 2 is 18 μm, so the parasitic capacitance between the touch drive line Tx and the touch sensing line Rx is 1.54 fF. It can be seen that given the same third distance $d_3$, the parasitic capacitance between the touch drive line Tx and the touch sensing line Rx is reduced by about 65% where the shield line 103 is added.

In the solution shown in FIG. 5, the parasitic capacitance between the touch drive line Tx and the touch sensing line Rx is 0.28 fF. Comparing the solutions shown in FIGS. 4 and 5, it can be seen that given the same number of shield lines 103 and the same line width $w_1$, where the fourth distance $d_4$ and the fifth distance $d_5$ are each increased from 4 μm shown in FIG. 4 to 24 μm shown in FIG. 5, the parasitic capacitance between the touch drive line Tx and the touch sensing line Rx can be reduced from 0.54 fF to 0.28 fF, that is, reduced by about 48%.

In the solution shown in FIG. 6, the parasitic capacitance between the touch drive line Tx and the touch sensing line Rx is 0.15 fF. Compared with the solution shown in FIG. 4, it can be seen that under the condition that the fourth distance $d_4$ is equal to the fifth distance $d_5$ (both are 4 μm), where the line width $w_1$ of the shield line 103 is increased from 10 μm shown in FIG. 4 to 50 μm shown in FIG. 6, the parasitic capacitance between the touch drive line Tx and the touch sensing line Rx can be reduced from 0.54 fF to 0.15 fF, that is, reduced by about 72%. Compared with the solution of increasing the fourth distance $d_4$ and the fifth distance $d_5$ to reduce the parasitic capacitance in FIG. 5, the solution of increasing the line width $w_1$ of the shield line 103 shown in FIG. 6 achieves a better shielding effect than the solution of simply increasing the fourth distance $d_4$ and the fifth distance $d_5$.

In the solution shown in FIG. 7, the parasitic capacitance between the touch drive line Tx and the touch sensing line Rx is 0.09 fF. Different from the solution of simply increasing the third distance $d_3$ in FIG. 5, the solution of increasing both the third distance $d_3$ and the line width $w_1$ of the shield line 103 in FIG. 7 can achieve a better shielding effect. For a foldable product with relatively long touch drive lines Tx and touch sensing lines Rx, the solution shown in FIG. 7 may be selected to achieve a stronger shielding effect.

In the solution shown in FIG. 8, the parasitic capacitance between the touch drive line Tx and the touch sensing line Rx is 0.08 fF. Comparing the solutions shown in FIGS. 7 and 8, it can be seen that given the same third distance $d_3$, the solution of increasing the number of shield lines 103 shown in FIG. 8 can achieve a stronger shielding effect. In addition, in the solutions shown in FIGS. 9 to 11, the parasitic capacitance between the touch drive line Tx and the touch sensing line Rx is 0.06 fF. Compared with the solution shown in FIG. 8, it can be seen that where the number of shield lines 103 is increased from 2 to 3, 4, and 5 in sequence, the parasitic capacitance is further reduced, but where the number of shield lines 103 is 3, 4, and 5, equivalent shielding effects are obtained. Therefore, to save the raw material cost, reduce the difficulty in the manufacturing process, and save the wiring space, the solution using three shield lines 103 as shown in FIG. 9 may be selected in the present disclosure.

Figure 12:
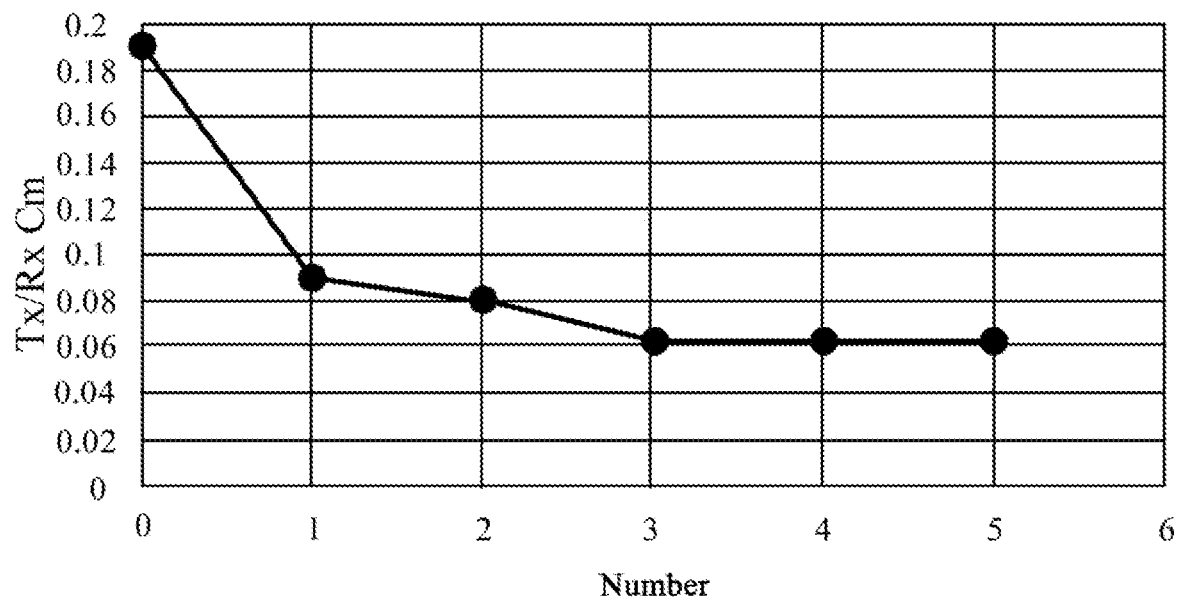
FIG. 12 is a diagram showing a relationship between the number of shield lines and the shielding effect according to an embodiment of the present disclosure.

In addition, to show the shielding effects of the solutions shown in FIGS. 7 to 11 more intuitively, the parasitic capacitances obtained in the solutions shown in FIGS. 7 to 11 are illustrated by a bent line shown in FIG. 12 in the present disclosure. Meanwhile, FIG. 12 further shows the parasitic capacitance between the touch drive line Tx and the touch sensing line Rx where no shield line 103 is provided between the touch drive line Tx and the touch sensing line Rx (i.e., the number of shield lines 103 is 0), while ensuring that the third distance $d_3$ between the touch drive line Tx and the touch sensing line Rx is 100 μm, as shown in FIGS. 7 to 11. Specifically, the abscissa of FIG. 12 represents the number of shield lines 103 between the touch drive line Tx and the touch sensing line Rx, while the ordinate represents the parasitic capacitance (Cm) between the touch drive line Tx and the touch sensing line Rx. As can be seen from FIG. 12, under the condition that no shield line 103 is provided between the touch drive line Tx and the touch sensing line Rx, the parasitic capacitance between the touch drive line Tx and the touch sensing line Rx is 0.19 fF; as the number of shield lines 103 between the touch drive line Tx and the touch sensing line Rx is increased from 0 to 3, the parasitic capacitance between the touch drive line Tx and the touch sensing line Rx is gradually reduced; and as the number of shield lines 103 between the touch drive line Tx and the touch sensing line Rx is increased from 3 to 5, the parasitic capacitance between the touch drive line Tx and the touch sensing line Rx is hardly changed.

In some embodiments, as shown in FIGS. 8 to 11, in the display substrate provided in the embodiments of the present disclosure, under the condition that the number of the at least one shield line 103 is greater than or equal to 2, a sixth distance $d_6$ is provided between two adjacent shield lines 103. Optionally, the sixth distance $d_6$, the fourth distance $d_4$, and the fifth distance $d_5$ may be substantially the same (i.e., the same or within a 5% error range due to the manufacturing process, measurement, etc.), so that the shield lines 103 are uniformly distributed within the third distance $d_3$, which is beneficial to uniform etching of a film layer where the shield lines 103 are located.

In some embodiments, as shown in FIGS. 9 to 11, in the display substrate provided in the embodiments of the present disclosure, under the condition that the number of the at least one shield line 103 is greater than or equal to 3, each of the fourth distance $d_4$, the fifth distance $d_5$, and the sixth distance $d_6$ may be substantially equal to (i.e., equal to or within a 5% error range due to the manufacturing process, measurement, etc.) the first distance $d_1$, thereby avoiding a short circuit between the shield lines 103 and the touch sensing line Tx or the touch sensing line Rx, while ensuring a larger line width $w_1$ of each shield line 103 as well as a better shielding effect.

In some embodiments, as shown in FIGS. 8 to 11, in the display substrate provided in the embodiments of the present disclosure, under the condition that the number of the at least one shield line 103 is greater than or equal to 2, and the fourth distance $d_4$, the fifth distance $d_5$, and the sixth distance $d_6$ may be substantially the same (e.g., equal to the first distance $d_1$), the third distance $d_3$ for providing the shield lines 103 on the basis of satisfying a narrow-bezel effect is limited, while the third distance $d_3$ is equal to a sum of the line width $w_1$ of each shield line 103, the fourth distance $d_4$, the fifth distance $d_5$, and at least one sixth distance $d_6$, where the number of sixth distances $d_6$ is one less than the total number of shield lines 103. Therefore, a greater sum of the fourth distance $d_4$, the fifth distance $d_5$, and the at least one sixth distance $d_6$ leads to a smaller line width $w_1$ of each shield line 103. Further, under the condition that the fourth distance $d_4$, the fifth distance $d_5$, and the sixth distance $d_6$ are substantially the same, the sum of the fourth distance $d_4$, the fifth distance $d_5$, and the at least one sixth distance $d_6$ is equal to a sum of at least n sixth distances, where n is one plus the total number of shield lines 103. On this basis, the line width $w_1$ of the shield line 103 is inversely related to the total number of the at least one shield line 103 as a whole. For example, in FIGS. 8 to 11, the number of shield lines 103 is 2, 3, 4, 5 in sequence, and accordingly, the line width $w_1$ of the shield line 103 is 35 μm, 28 μm, 20 μm, 15.2 μm in sequence.

Figure 3:
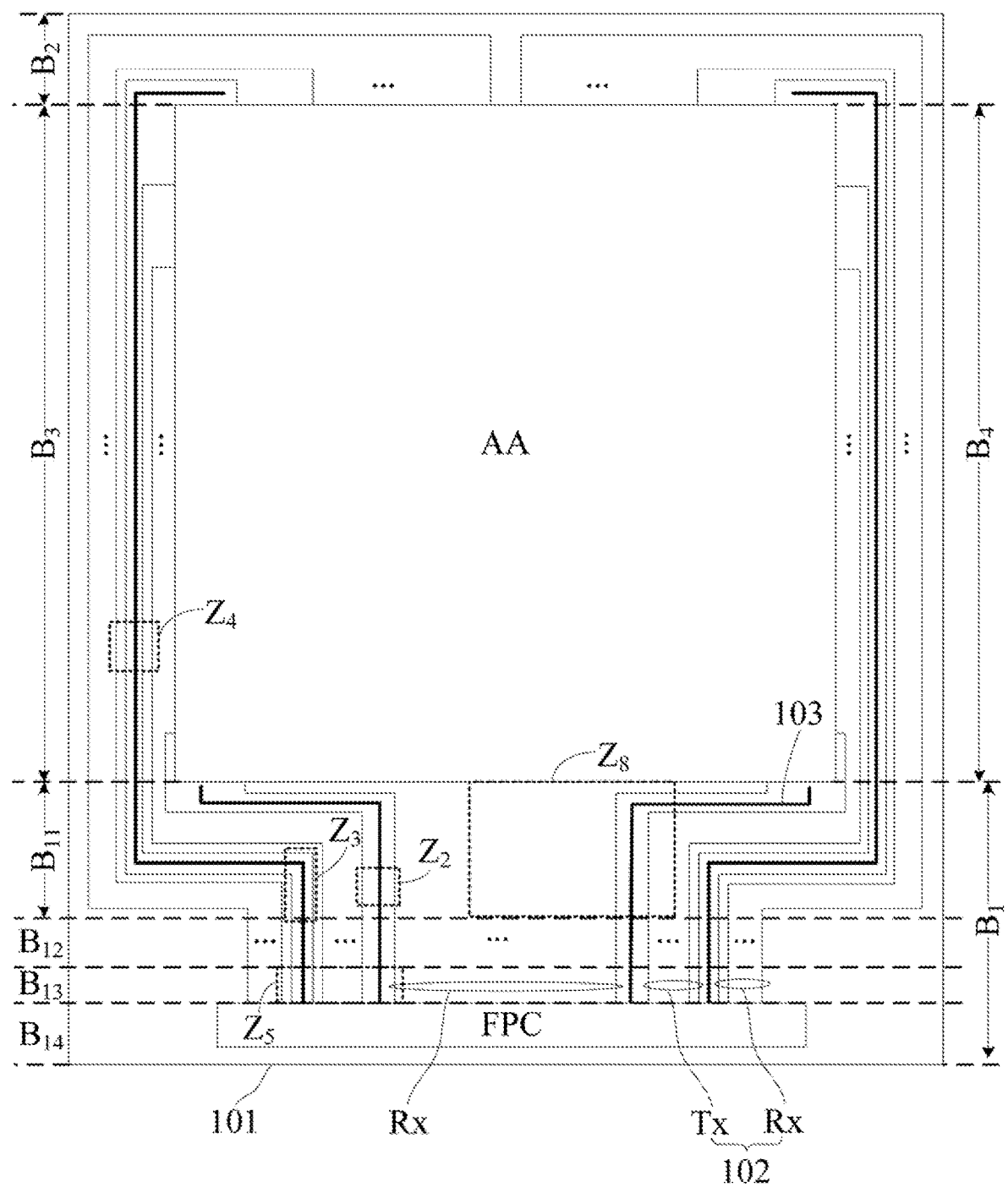
FIG. 3 is another schematic structural view of a display substrate according to an embodiment of the present disclosure.

In some embodiments, as shown in FIG. 3, in the display substrate provided in the embodiments of the present disclosure, the bezel region may include a first bezel region $B_1$ on a side of the display region AA, a second bezel region $B_2$ opposite to the first bezel region $B_1$, and a third bezel region $B_3$ and a fourth bezel region $B_4$ each connecting the first bezel region $B_1$ and the second bezel region $B_2$. The first bezel region $B_1$ includes a first fan-out region $B_{11}$, a bending region $B_{12}$, and a second fan-out region $B_{13}$ arranged in sequence along a direction away from the display region AA. Optionally, a bonding region $B_{14}$ bonded to a circuit board (e.g., a flexible printed circuit, FPC) is located on a side of the second fan-out region $B_{13}$ away from the display region AA. In some embodiments, as shown in FIGS. 13 to 19, at least one of the shield lines 103 includes a main body part 31 and at least two branch parts 32. The main body part 31 and the at least two branch parts 32 of the same shield line 103 are integrally formed. The main body part 31 is located in the second fan-out region $B_{13}$ and the bending region $B_{12}$. Each of the branch parts 32 is located in at least parts of the first fan-out region $B_{11}$, the second bezel region $B_2$, the third bezel region $B_3$, and the fourth bezel region $B_4$. By dividing at least one of the shield lines 103 into at least two branch parts 32 on a side of the bending region $B_{12}$ away from the bonding region $B_{14}$, it is equivalent to that in a region of the bending region $B_{12}$ away from the bonding region $B_{14}$, at least two branch parts 32 are used for shielding interference between the touch drive line Tx and the touch sensing line Rx, which is beneficial to improving the touch performance. Meanwhile, the at least two branch parts 32 may share one main body part 31 and be electrically connected to one pin of a circuit board (e.g., flexible printed circuit, FPC), so that compared with the solution of electrically connecting each branch part 32 to the circuit board (e.g., flexible printed circuit, FPC) via a corresponding pin, the present disclosure can reduce the number of pins of the circuit board (e.g., flexible printed circuit, FPC), save the space occupied by the circuit board (e.g., flexible printed circuit, FPC), reduce the loading, and reduce the power consumption.

Figure 13:
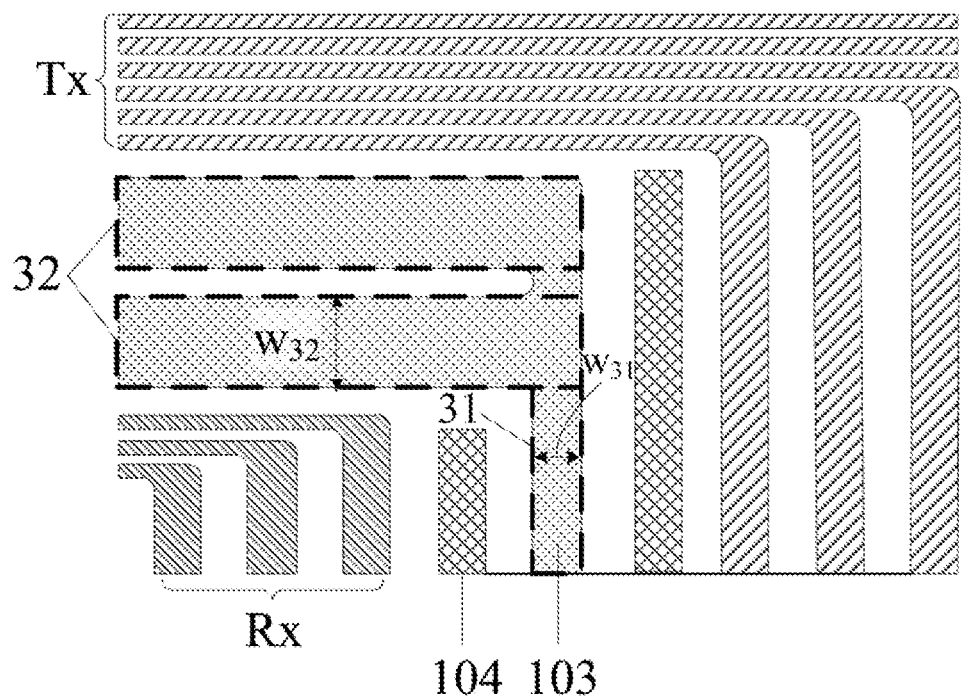
FIG. 13 is a schematic enlarged structural view of region $Z_3$ in FIG. 3.
Figure 16:
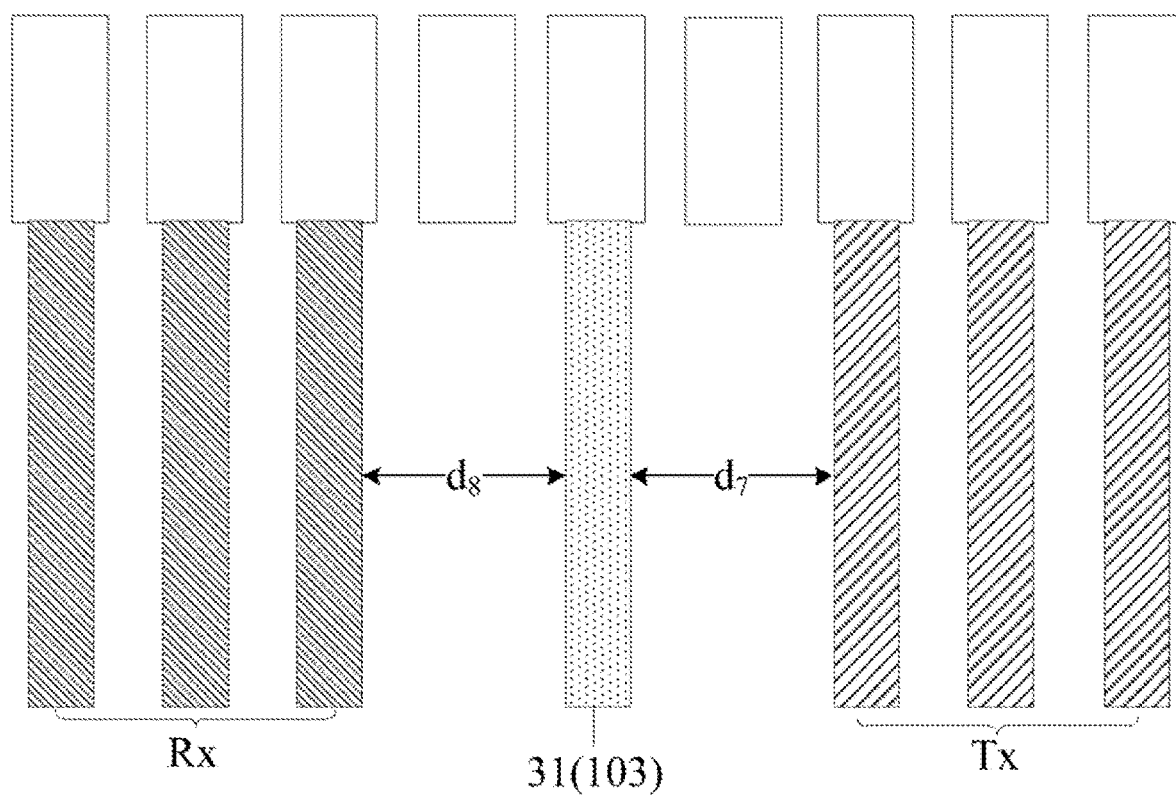
FIG. 16 is a schematic enlarged structural view of region $Z_6$ in FIG. 15.

In some embodiments, as shown in FIGS. 13 and 16, in the display substrate provided in the embodiments of the present disclosure, the main body part 31 may have a line width $w_{31}$ substantially equal to (i.e., equal to or within a 5% error range due to the manufacturing process, measurement, etc.) 2.5 times the first distance $d_1$. A seventh distance $d_7$ is provided between the main body part 31 and the plurality of touch drive lines Tx as a whole, an eighth distance $d_8$ is provided between the main body part 31 and the plurality of touch sensing lines Rx as a whole, and the seventh distance $d_7$ and the eighth distance $d_8$ are each greater than or equal to the first distance $d_1$, and less than or equal to 4.5 times the first distance $d_1$.

Figure 14:
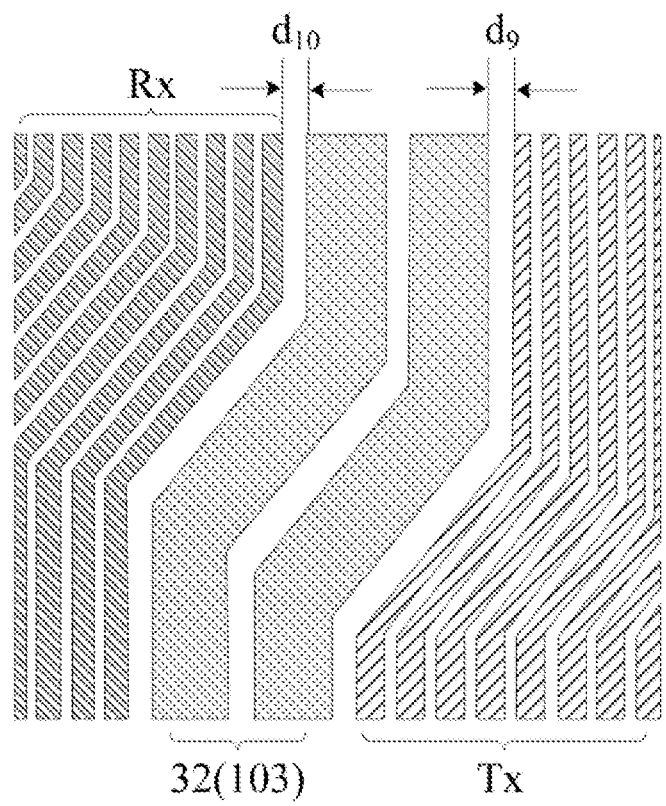
FIG. 14 is a schematic enlarged structural view of region $Z_4$ in FIG. 3.

In some embodiments, as shown in FIGS. 13 and 14, in the display substrate provided in the embodiments of the present disclosure, each branch part 32 may have a line width $w_{32}$ greater than or equal to 2.5 times the first distance $d_1$, and less than or equal to 12.5 times the first distance $d_1$. A ninth distance $d_9$ is provided between the branch parts 32 and the plurality of touch drive lines Tx as a whole, a tenth distance $d_{10}$ is provided between the branch parts 32 and the plurality of touch sensing lines Rx as a whole, and the ninth distance $d_9$ and the tenth distance $d_{10}$ are each greater than or equal to the first distance $d_1$ and less than or equal to 12.5 times the first distance $d_1$.

Figure 15:
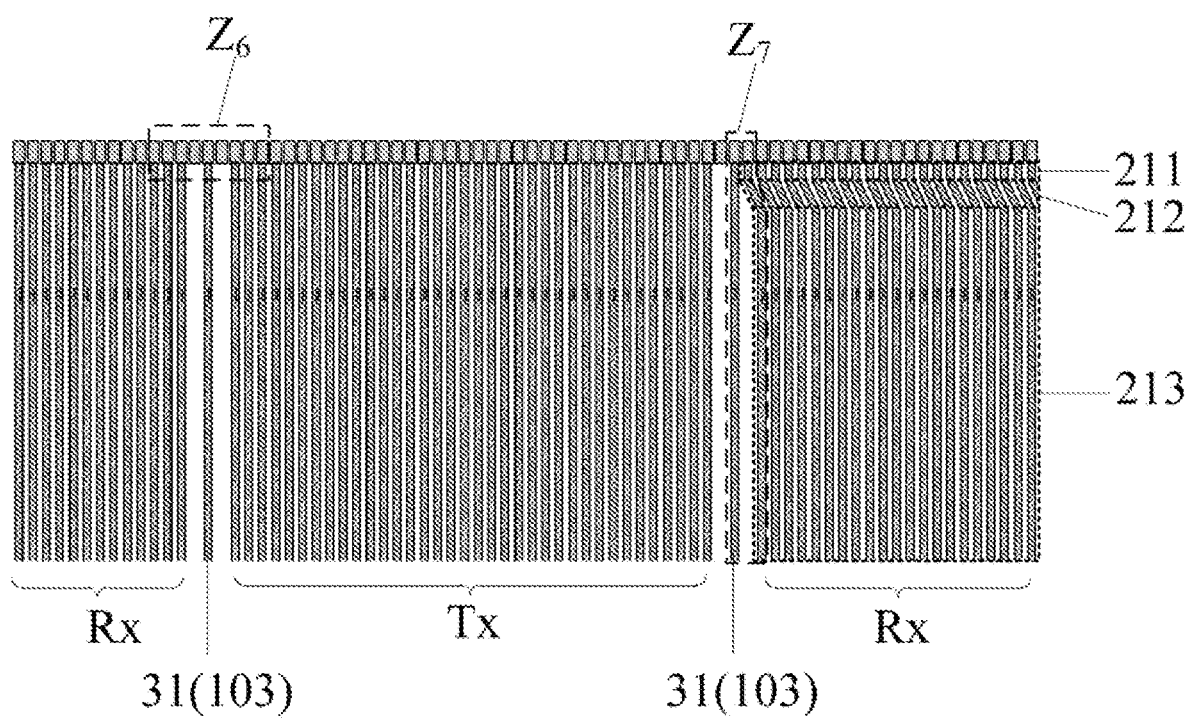
FIG. 15 is a schematic enlarged structural view of region $Z_5$ in FIG. 3.
Figure 17:
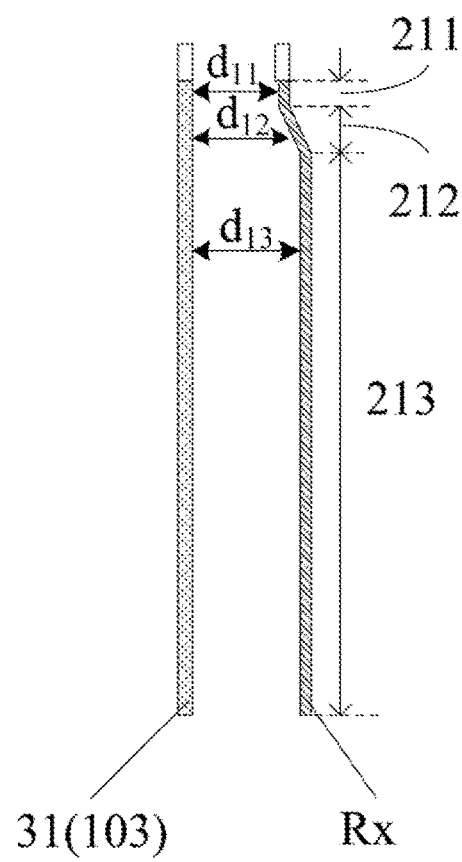
FIG. 17 is a schematic enlarged structural view of region $Z_7$ in FIG. 15.
Figure 18:
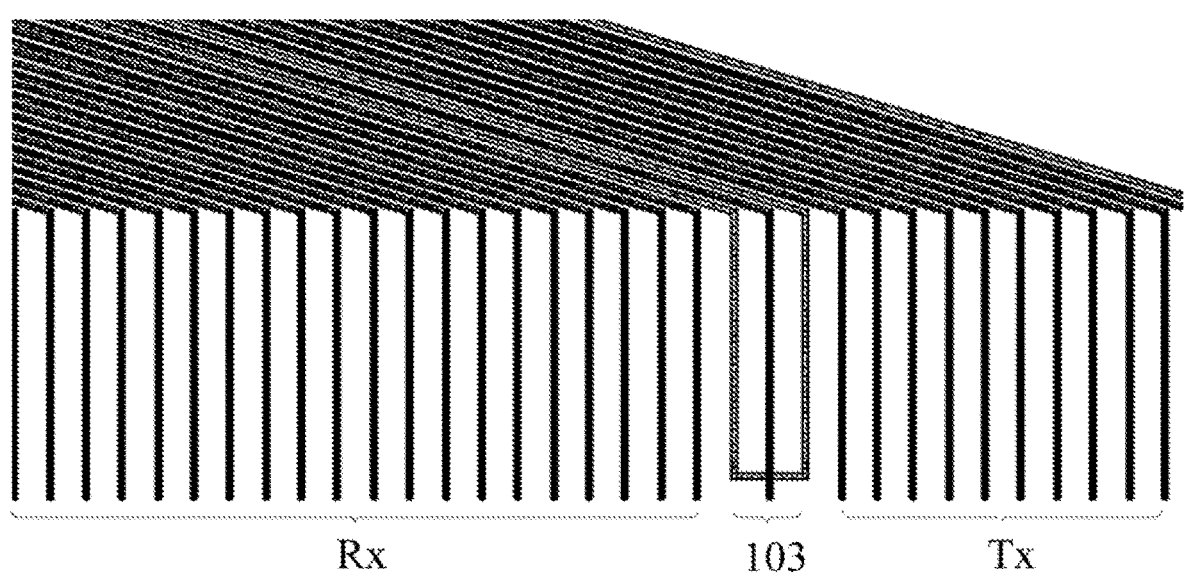
FIG. 18 is a schematic structural view showing a shield line led out of a pin of a flexible printed circuit and forming three branches according to an embodiment of the present disclosure.

In some embodiments, in the display substrate provided in the embodiments of the present disclosure, a problem of insufficient wiring space may occur at a position of the second fan-out region $B_{13}$ adjacent to the bending region $B_{12}$, and to ensure the distance between the main body part 31 and the touch drive lines Tx or the touch sensing lines Rx, as shown in FIGS. 15 and 17, the touch drive line Tx and/or the touch sensing line Rx on at least one side of the main body part 31 may be provided with: a first touch part 211, a second touch part 212, and a third touch part 213 connected in sequence along a direction away from the display region AA. An eleventh distance $d_{11}$ is provided between the first touch part 211 and the main body part 31, a twelfth distance $d_{12}$ is provided between the second touch part 212 and the main body part 31, and a thirteenth distance $d_{13}$ is provided between the third touch part 213 and the main body part 31. The eleventh distance $d_{11}$ may be substantially equal to (i.e., equal to or within a 5% error range due to the manufacturing process, measurement, etc.) the first distance $d_1$, the twelfth distance $d_{12}$ may be greater than the first distance $d_1$ and less than 4.5 times the first distance $d_1$, and the thirteenth distance $d_{13}$ may be substantially equal to (i.e., equal to or within a 5% error range due to the manufacturing process, measurement, etc.) 4.5 times the first distance $d_1$.

In some embodiments, as shown in FIGS. 20 to 23, in the display substrate provided in the embodiments of the present disclosure, at least one ground line 104 may be further provided between the plurality of touch drive lines Tx as a whole and the plurality of touch sensing lines Rx as a whole, and the ground line 104 and the shield line 103 are disposed independent from each other, so that the ground line 104 and the shield line 103 work jointly to shield touch drive signals of the touch drive lines Tx and touch sensing signals of the touch sensing lines Rx from each other.

Figure 20:
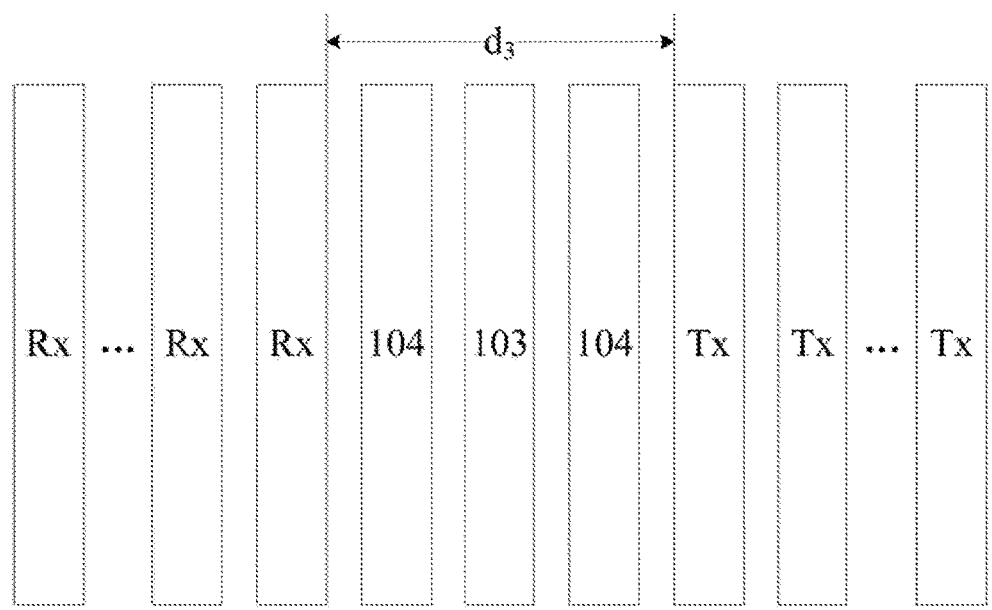
FIG. 20 is another schematic enlarged structural view of region $Z_2$ in FIG. 3.
Figure 21:
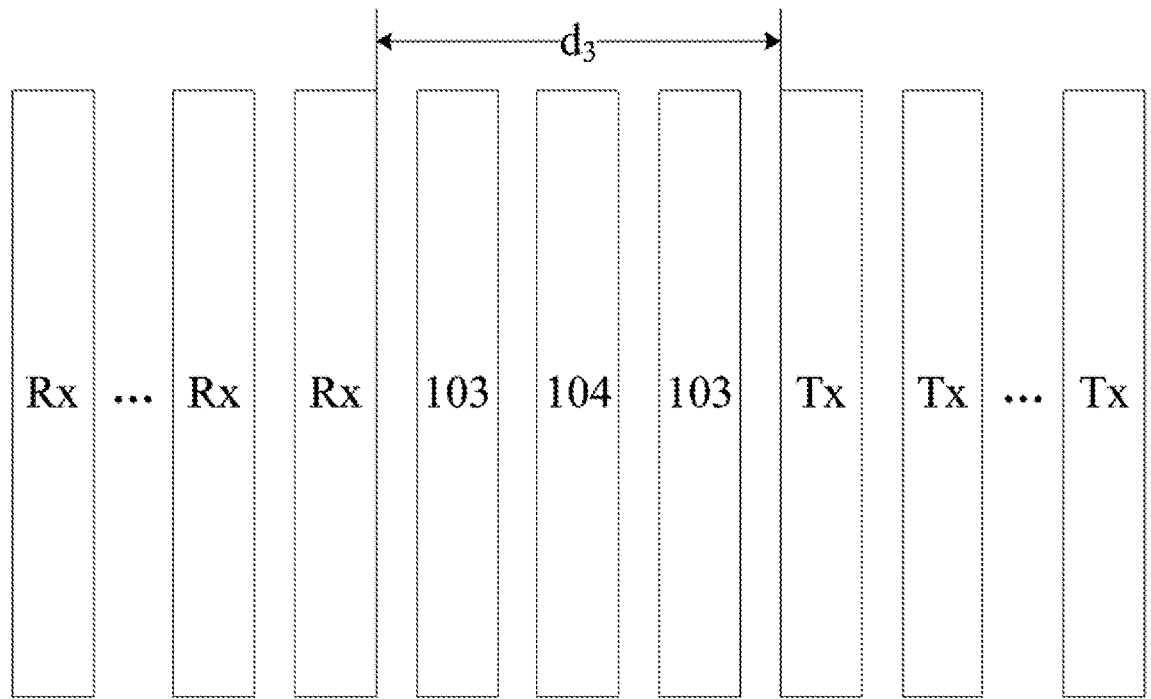
FIG. 21 is another schematic enlarged structural view of region $Z_2$ in FIG. 3.
Figure 22:
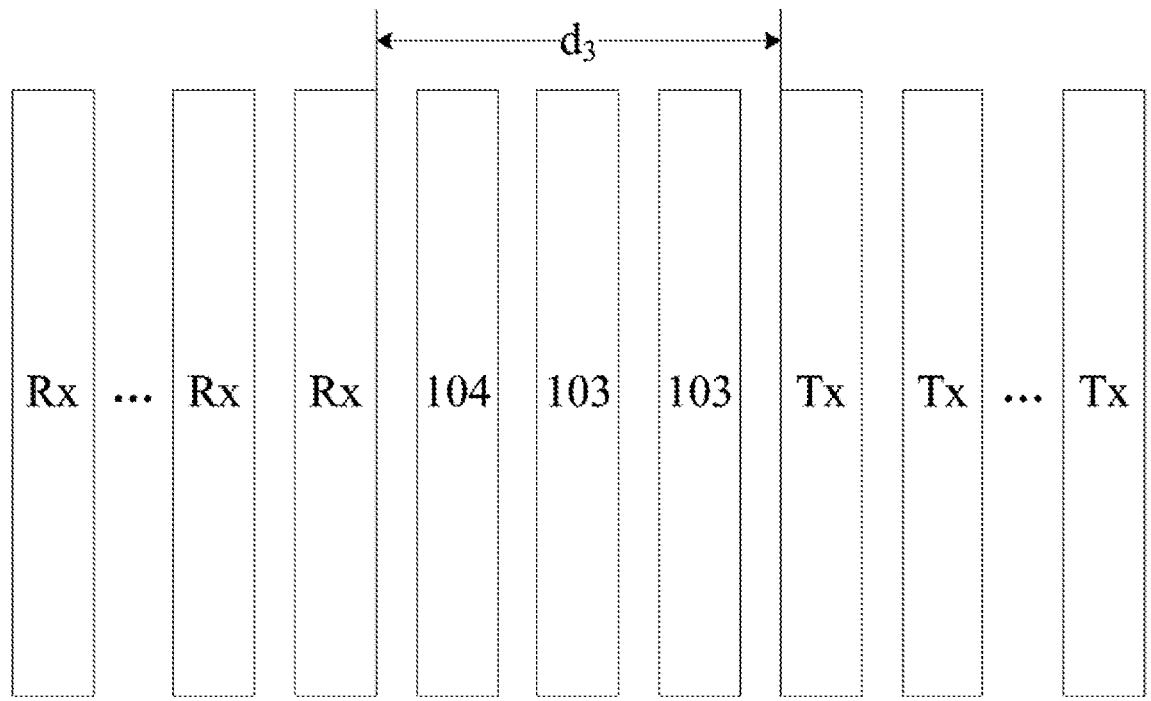
FIG. 22 is another schematic enlarged structural view of region $Z_2$ in FIG. 3.
Figure 23:
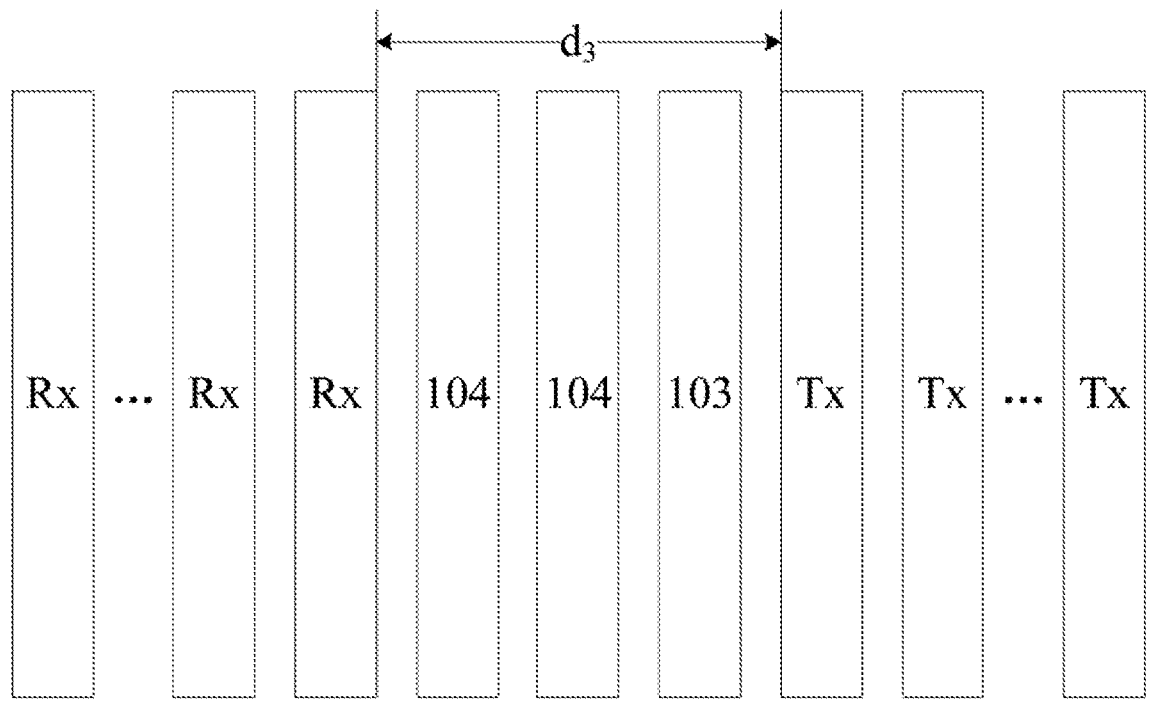
FIG. 23 is another schematic enlarged structural view of region $Z_2$ in FIG. 3.

In some embodiments, as shown in FIGS. 20 and 21, in the display substrate provided in the embodiments of the present disclosure, the ground line 104 and the shield line 103 may be arranged alternatively between the plurality of touch drive lines Tx as a whole and the plurality of touch sensing lines Rx as a whole. Alternatively, as shown in FIGS. 21 to 23, at least part of the shield lines 103 may be disposed closer to the plurality of touch drive lines Tx than the at least one ground line 104 as a whole. In some embodiments, the shield line 103 may be loaded with the same ground signal as the ground line 104, or the shield line 103 may be loaded with the same touch drive signal as the touch drive line Tx. Since the same type of signals do not interfere with each other, under the condition that the shield line 103 is loaded with the same touch drive signal as the touch drive line Tx, the at least part of the shield lines 103 disposed closer to the plurality of touch drive lines Tx than the at least one ground line 104 as a whole can better shield interference of the touch sensing signals of the touch sensing lines Rx with the touch drive signals of the touch drive lines Tx.

In some embodiments, in the display substrate provided in the embodiments of the present disclosure, the display region AA may be provided with touch drive electrodes electrically connected to the touch drive lines Tx, and touch sensing electrodes electrically connected to the touch sensing lines Rx. Optionally, the touch drive electrodes and the touch sensing electrodes are both located in a touch layer (TMB), the touch drive electrodes or the touch sensing electrodes are electrically connected through a bridging layer (TMA), and an insulation layer is disposed between the touch layer and the bridging layer. Optionally, to reduce the resistance, the touch drive lines Tx and the touch sensing lines Rx may be wired in both the touch layer and the bridging layer, and accordingly, the shield line 103 may have a double-layer wiring structure in the touch layer and the bridging layer. For the same signal line (e.g., the touch drive line Tx, the touch sensing line Rx, or the shield line 103), a trace in the touch layer and a trace in the bridging layer are electrically connected through a via running through the insulation layer.

Figure 19:
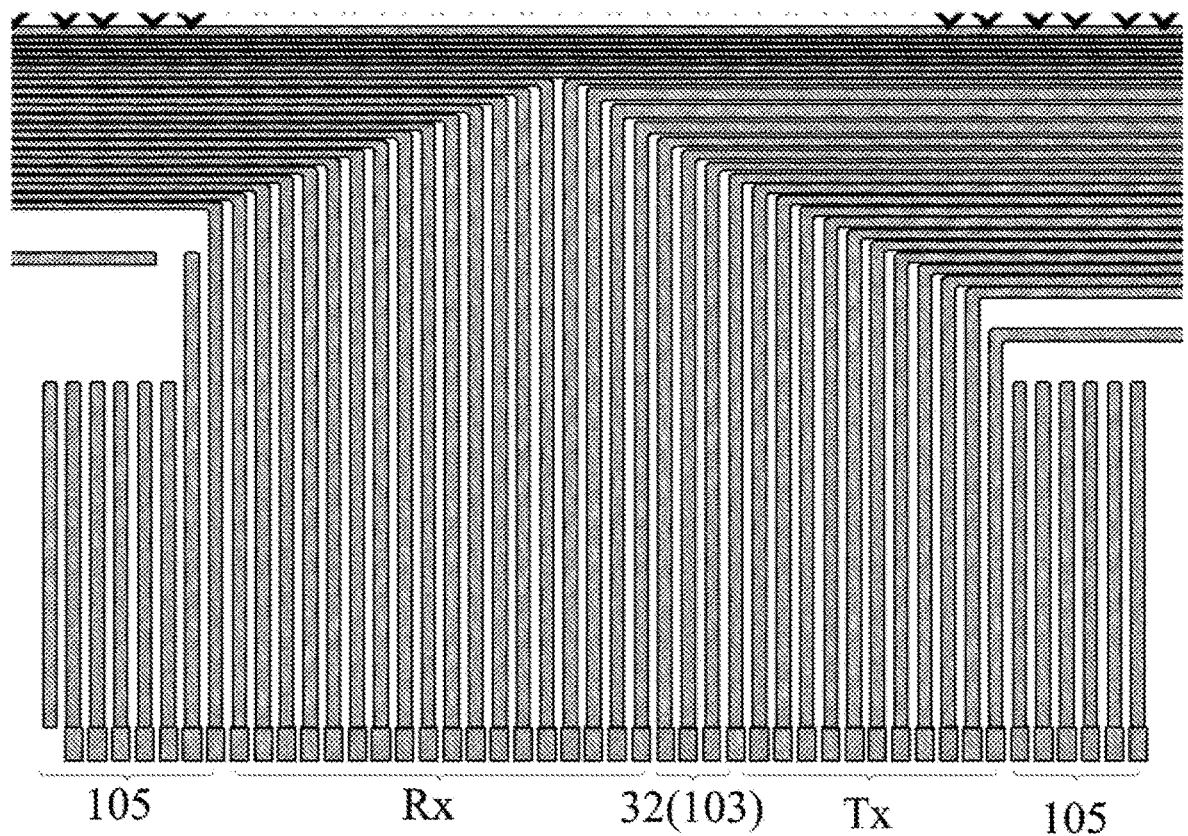
FIG. 19 is a schematic enlarged structural view of region $Z_8$ in FIG. 3.

In some embodiments, in the first fan-out region $B_{11}$, as shown in FIG. 19, dummy lines 105 may be further provided on two sides of the overall structure formed by the plurality of touch drive lines Tx and the plurality of touch sensing lines Rx, to prevent poor touch control due to wrinkles or even abnormal falling out of the insulation layer between the touch layer and the bridging layer. The dummy lines 105 may be wired in at least one of the bridging layer or the touch layer, and for an enhanced reinforcing effect of the insulation layer, the number of dummy lines 105 wired in the bridging layer may be smaller than that in the touch layer, so that a part of the dummy lines 105 near the touch drive lines Tx or the touch sensing lines Rx have a double-layer wiring structure in the bridging layer and the touch layer, while the remaining dummy lines 105 away from the touch drive lines Tx or the touch sensing lines Rx have a single-layer wiring structure in the touch layer.

Figure 24:
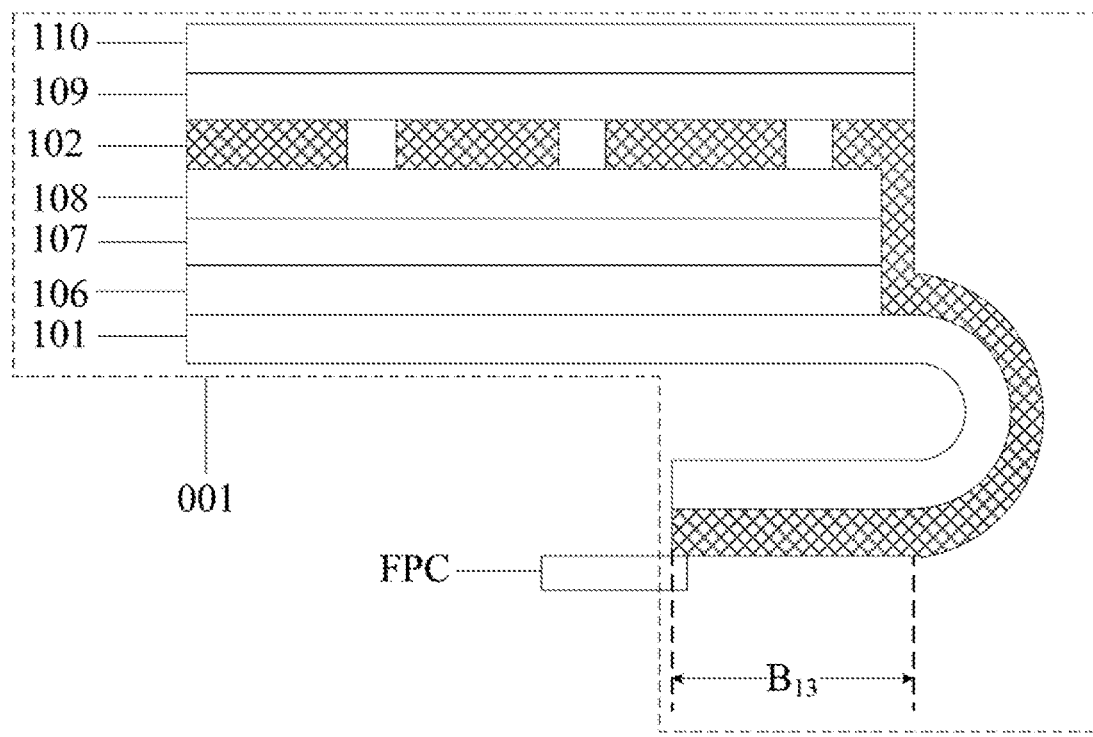
FIG. 24 is a schematic structural diagram of a display apparatus according to an embodiment of the present disclosure.

In some embodiments, as shown in FIG. 24, the display substrate provided in the embodiments of the present disclosure may further include a layer 106 where a pixel circuit is located, a layer 107 where a light-emitting device is located, an encapsulation layer 108, a circular polarizer 109, a protective cover plate 110, and the like. In some embodiments, a color filter (CF) may be used instead of the circular polarizer 109, which is not limited herein. Other essential components of the display substrate are regarded as present by those skilled in the art, which are not described herein and should not be construed as limiting the present disclosure.

Based on the same inventive concept, the present disclosure further provides a display apparatus which, as shown in FIG. 24, includes the display substrate 001 provided in the embodiments of the present disclosure, where the display substrate 001 may be a display substrate such as an OLED display substrate or a QLED display substrate. Since the display apparatus is used to solve the problem based on a principle similar to that of the display substrate, the implementation of the display apparatus may refer to the embodiments of the display substrate described above, and repeated descriptions are omitted.

In some embodiments, as shown in FIG. 24, the display apparatus provided in the embodiments of the present disclosure may further include a flexible printed circuit FPC electrically connected to the display substrate 001 and located on an opposite side to a display side (i.e., the side where the protective cover plate 110 is located) of the display apparatus.

In some embodiments, as shown in FIGS. 1, 3 and 24, the display substrate 001 includes a display region AA, and a first bezel region $B_1$ on a side of the display region AA and configured to be bonded to the flexible printed circuit FPC. The first bezel region $B_1$ includes a first fan-out region $B_{11}$, a bending region $B_{12}$, a second fan-out region $B_{13}$, and a bonding region $B_{14}$ arranged in sequence along a direction away from the display region AA. The first fan-out region $B_{11}$ is located on the display side (i.e., the side where the protective cover plate 110 is located), and the second fan-out region $B_{13}$ is located on the opposite side to the display side (i.e., the side where the protective cover plate 110 is located), so as to facilitate the bonding connection between the touch lines 102 and the flexible printed circuit FPC in the second fan-out region $B_{13}$. In addition, the second fan-out region $B_{13}$ is bent toward the opposite side to the display side (i.e. the side where the protective cover plate 110 is located), so that a width of the first bezel region $B_1$ where the second fan-out region $B_{13}$ is located can be effectively reduced, and the narrow-bezel design of the first bezel region $B_1$ can be facilitated.

In some embodiments, the display apparatus provided in the embodiments of the present disclosure may be: a projector, a 3D printer, a virtual reality device, a mobile phone, a tablet, a television, a monitor, a laptop, a digital album, a navigator, a smart watch, a fitness wristband, a personal digital assistant, or any other product or component having a display function. The display apparatus includes, but is not limited to: a radio frequency unit, a network module, an audio output/input unit, a sensor, a display unit, a user input unit, an interface unit, a control chip, or the like. Optionally, the control chip is a central processing unit, a digital signal processor, a system on chip (SoC), or the like. For example, the control chip may further include a memory, a power module, or the like, and power supply and signal input/output functions are realized through additionally wires, signal lines, and the like. For example, the control chip may further include a hardware circuit, a computer-executable code, or the like. The hardware circuit may include a conventional very large scale integrated (VLSI) circuit or a gate array, or an existing semiconductor such as a logic chip, a transistor, or any other discrete element. The hardware circuit may further include a field-programmable gate array, a programmable array logic, a programmable logic device, or the like. In addition, it will be understood by those skilled in the art that the above-described structures do not constitute any limitation to the display apparatus provided in the embodiments of the present disclosure. In other words, the display apparatus provided in the embodiments of the present disclosure may include more or fewer components than described, or a combination of some components, or a different arrangement of components.

Although the present disclosure has described preferred embodiments, it will be understood that those skilled in the art may make various changes and variations to the embodiments of the present disclosure without departing from the spirit and scope of the embodiments of the present disclosure. Therefore, if such modifications and variations to the embodiments of the present disclosure are within the scope of the claims of the present disclosure and their equivalents, the present disclosure is also intended to encompass such modifications and variations.

What is claimed is:

1. A display substrate, comprising:
a base substrate comprising a display region and a bezel region on at least one side of the display region;
a plurality of touch lines in the bezel region, comprising a plurality of touch drive lines and a plurality of touch sensing lines, wherein a first distance is provided between any two adjacent touch drive lines in the plurality of touch drive lines, a second distance is provided between any two adjacent touch sensing lines in the plurality of touch sensing lines, a third distance is provided between the plurality of touch drive lines and the plurality of touch sensing lines, the first distance is substantially equal to the second distance, and the third distance is greater than each of the first distance and the second distance,
wherein the third distance is greater than or equal to 4.5 times the first distance, and less than or equal to 37.5 times the first distance.

2. The display substrate according to claim 1, wherein a blank is reserved between the plurality of touch drive lines and the plurality of touch sensing lines.

3. The display substrate according to claim 1, further comprising at least one shield line between the plurality of touch drive lines and the plurality of touch sensing lines.

4. The display substrate according to claim 3, wherein the shield line has a line width greater than or equal to 2.5 times the first distance, and less than or equal to 12.5 times the first distance.

5. The display substrate according to claim 3, wherein a fourth distance is provided between the at least one shield line and the plurality of touch drive lines, a fifth distance is provided between the at least one shield line and the plurality of touch sensing lines, and the fourth distance and the fifth distance are each greater than or equal to the first distance, and less than or equal to 12.5 times the first distance.

6. The display substrate according to claim 5, wherein the number of the at least one shield line is 1, and the fourth distance and the fifth distance are each greater than a line width of the shield line.

7. The display substrate according to claim 5, wherein the number of the at least shield line is a positive integer, and the fourth distance and the fifth distance are each smaller than a line width of the shield line.

8. The display substrate according to claim 7, wherein the number of the at least one shield line is greater than or equal to 2, a sixth distance is provided between any two adjacent shield lines, and the sixth distance, the fourth distance and the fifth distance are substantially the same.

9. The display substrate according to claim 8, wherein the number of the at least one shield line is greater than or equal to 3, and the fourth distance, the fifth distance, and the sixth distance are each substantially equal to the first distance, or wherein the line width of the shield line is inversely related to the number of the at least one shield line.

10. The display substrate according to claim 3, wherein the bezel region comprises a first bezel region on a side of the display region, a second bezel region opposite to the first bezel region, and a third bezel region and a fourth bezel region each connecting the first bezel region and the second bezel region, wherein the first bezel region comprises a first fan-out region, a bending region, and a second fan-out region arranged in sequence along a direction away from the display region; and
the at least one shield line each comprises a main body part and at least two branch parts, wherein the main body part and the at least two branch parts of the same shield line are integrally formed, the main body part is located in the second fan-out region and the bending region, and the at least two branch parts are located in at least parts of the first fan-out region, the second bezel region, the third bezel region, and the fourth bezel region.

11. The display substrate according to claim 10, wherein the main body part has a line width substantially equal to 2.5 times the first distance.

12. The display substrate according to claim 10, wherein a seventh distance is provided between the main body part and the plurality of touch drive lines, an eighth distance is provided between the main body part and the plurality of touch sensing lines, and the seventh distance and the eighth distance are each greater than or equal to the first distance, and less than or equal to 4.5 times the first distance.

13. The display substrate according to claim 10, wherein each branch part has a line width greater than or equal to 2.5 times the first distance, and less than or equal to 12.5 times the first distance.

14. The display substrate according to claim 10, wherein a ninth distance is provided between the branch parts and the plurality of touch drive lines, a tenth distance is provided between the branch parts and the plurality of touch sensing lines, and the ninth distance and the tenth distance are each greater than or equal to the first distance, and less than or equal to 12.5 times the first distance.

15. The display substrate according to claim 13, wherein in the second fan-out region, the touch drive line or the touch sensing line on at least one side of the main body part each comprise: a first touch part, a second touch part, and a third touch part connected in sequence along a direction away from the display region, wherein
an eleventh distance is provided between the first touch part and the main body part, a twelfth distance is provided between the second touch part and the main body part, a thirteenth distance is provided between the third touch part and the main body part, the eleventh distance is substantially equal to the first distance, the twelfth distance is greater than the first distance and less than 4.5 times the first distance, and the thirteenth distance is substantially equal to 4.5 times the first distance.

16. The display substrate according to claim 3, further comprising at least one ground line between the plurality of touch drive lines and the plurality of touch sensing lines, wherein the ground line and the shield line are disposed independent from each other.

17. The display substrate according to claim 16, wherein the at least one ground line and the at least one shield line are arranged alternatively between the plurality of touch drive lines and the plurality of touch sensing lines, or
wherein at least part of the at least one shield line is disposed closer to the plurality of touch drive lines than the at least one ground line.

18. The display substrate according to claim 1, wherein each touch line has a line width substantially equal to 2.5 times the first distance.

19. A display apparatus, comprising the display substrate according to claim 1 and a flexible printed circuit electrically connected to the display substrate and located on an opposite side to a display side of the display apparatus.

20. The display apparatus according to claim 19, wherein the display substrate comprises a display region, and a first bezel region on a side of the display region and configured to be bonded to the flexible printed circuit; wherein the first bezel region comprises a first fan-out region, a bending region, and a second fan-out region arranged in sequence along a direction away from the display region, wherein the first fan-out region is located on the display side, and the second fan-out region is located on the opposite side.

\* \* \* \* \*